(12) United States Patent
Mizukami et al.

(10) Patent No.: US 7,791,127 B2
(45) Date of Patent: Sep. 7, 2010

(54) SEMICONDUCTOR MEMORY AND METHOD FOR MANUFACTURING A SEMICONDUCTOR MEMORY

(75) Inventors: Makoto Mizukami, Kawasaki (JP); Shigeru Kinoshita, Yokohama (JP); Shigeyuki Takagi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 854 days.

(21) Appl. No.: 11/676,847

(22) Filed: Feb. 20, 2007

(65) Prior Publication Data

US 2007/0198766 A1 Aug. 23, 2007

(30) Foreign Application Priority Data

Feb. 22, 2006 (JP) .............................. P2006-045934

(51) Int. Cl.
*H01L 27/115* (2006.01)
*H01L 29/788* (2006.01)
*H01L 21/8247* (2006.01)

(52) U.S. Cl. ................ 257/315; 257/390; 257/E27.103; 257/E29.3; 257/E21.68; 438/257

(58) Field of Classification Search ................. 257/315, 257/390, E21.68, E21.681, E21.683, E21.687, 257/E21.691, E27.103, E29.3; 438/257
See application file for complete search history.

(56) References Cited

U.S. PATENT DOCUMENTS

| | | | |
|---|---|---|---|
| 6,426,529 B2 * | 7/2002 | Kobayashi | 257/316 |
| 6,818,505 B2 * | 11/2004 | Tsuji | 438/257 |
| 7,009,242 B2 * | 3/2006 | Nagai | 257/315 |
| 7,449,745 B2 * | 11/2008 | Matsui et al. | 257/316 |
| 7,589,374 B2 * | 9/2009 | Song et al. | 257/315 |
| 7,615,447 B2 * | 11/2009 | Purayath et al. | 438/257 |
| 7,687,860 B2 * | 3/2010 | Lee et al. | 257/361 |
| 2001/0020718 A1 * | 9/2001 | Takahashi et al. | 257/326 |
| 2003/0013254 A1 * | 1/2003 | Tsuji | 438/257 |
| 2005/0184327 A1 * | 8/2005 | Ozawa | 257/302 |
| 2006/0043461 A1 * | 3/2006 | Zuliani et al. | 257/315 |
| 2006/0261365 A1 * | 11/2006 | Hsu | 257/100 |
| 2007/0198766 A1 * | 8/2007 | Mizukami et al. | 711/101 |
| 2007/0264779 A1 * | 11/2007 | Hsiao et al. | 438/266 |
| 2008/0099824 A1 * | 5/2008 | Oh | 257/316 |
| 2008/0239821 A1 * | 10/2008 | Mokhlesi | 365/185.17 |
| 2010/0047979 A1 * | 2/2010 | Chien et al. | 438/257 |

FOREIGN PATENT DOCUMENTS

| | | |
|---|---|---|
| JP | 6-350097 | 12/1994 |
| JP | 9-172095 | 6/1997 |
| JP | 2000-174241 | 6/2000 |
| JP | 2003-7869 | 1/2003 |
| JP | 2004-56134 | 2/2004 |
| JP | 2005-72380 | 3/2005 |
| JP | 2006-41489 | 2/2006 |

* cited by examiner

*Primary Examiner*—Mary Wilczewski
(74) *Attorney, Agent, or Firm*—Oblon, Spivak, McClelland, Maier & Neustadt, L.L.P.

(57) ABSTRACT

A semiconductor memory includes: a first memory cell transistor including: a first floating gate electrode provided on and insulated from the substrate; and a first control gate electrode provided on and insulated from the first floating gate electrode; and a second memory cell transistor including: a second floating gate electrode provided on and insulated from the substrate, an upper surface being larger than a lower surface, and the upper surface being lower than an upper surface of the first floating gate electrode; and a second control gate electrode provided on and insulated from the second floating gate electrode.

13 Claims, 43 Drawing Sheets

SEMICONDUCTOR MEMORY AND METHOD FOR MANUFACTURING A SEMICONDUCTOR MEMORY

CROSS REFERENCE TO RELATED APPLICATIONS AND INCORPORATED BY REFERENCE

The application is based upon and claims the benefit of priority from the prior Japanese Patent Applications No. P2006-045934, filed on Feb. 22, 2006; the entire contents of which are incorporated herein by reference.

BACKGROUND OF THE INVENTION

1. Field of the Invention

This present invention relates to a semiconductor memory and a method for manufacturing a semiconductor memory.

2. Description of the Related Art

An electrically erasable programmable read-only memory (EEPROM) is known as a non-volatile semiconductor memory. In the EEPROM, a cell array is configured in such a way that a memory cell transistor is arranged at an intersection where a word line in the row direction and a bit line in the column direction cross over each other. Among the various EEPROMs, the NAND flash EEPROM in which a plurality of memory cell transistors are connected in series, and which can erase all the written data simultaneously, has been in wide use.

Each of the memory cell transistors of the non-volatile semiconductor memory has an insulated gate structure, and forms a stacked gate structure in which a floating gate electrode and a control gate electrode are stacked on a channel region. Between the control gate electrode and the floating gate electrode, an inter-electrode insulating film (interpoly) is disposed, and a gate insulating film (tunnel oxide film) is disposed between the channel region and the floating gate electrode. The floating gate electrodes adjacent to each other and the control gate electrodes adjacent to each other individually have the same structures.

The control gate electrode drives the floating gate electrode which electrically floats. In order to efficiently apply, to the floating gate electrode, a bias applied to the control gate electrode, it is necessary to increase the capacitance of a portion of the inter-electrode insulating film between the floating gate electrode and the control gate electrode. The increased capacitance should be greater than a capacitance of a portion of the gate insulating film between the floating gate electrode and the channel region when the inter-electrode insulating film and the gate insulating film are of the same thickness and material. For this purpose, a method is known which provides the inter-electrode insulating film and the control gate electrode from an upper surface of the floating gate electrode to a floating gate electrode adjacent thereto. This method increases the area where the upper and side surfaces of the floating gate electrode and the control gate electrode are opposite to each other. This increased area is larger than an area where only a lower surface of the floating gate electrode and the channel region are opposite to each other. By this method, the capacitance between the floating gate electrode and the control gate electrode is increased more than the capacitance between the floating gate electrode and the channel region.

However, as the memory cell transistor has continued to be integrated/miniaturized, the distance between the adjacent gate electrodes has become more narrow. Therefore, it has become difficult to arrange the inter-electrode insulating film and the control gate electrode between the adjacent floating gate electrodes. Hence, it has become difficult to increase the capacitance between the floating gate electrode and the control gate electrode more than the capacitance between the floating gate electrode and the channel region.

Moreover, since the distance between gates adjacent to each other has become narrow, the capacitance between the adjacent gates is increased. Owing to an influence from the capacitance between the adjacent gates, a threshold value of the memory cell transistor in which writing operation is not performed is varied, sometimes resulting in deterioration of write accuracy.

SUMMARY OF THE INVENTION

The present invention provides a semiconductor memory and a method for manufacturing a semiconductor memory, which can efficiently drive a floating gate electrode, and can decrease a gate capacitance.

An aspect of the present invention inheres in a semiconductor memory comprising a plurality of memory cell transistors arranged in a matrix on a substrate, the semiconductor memory including: a first memory cell transistor including: a first floating gate electrode provided on the substrate and insulated from the substrate; and a first control gate electrode provided on the first floating gate electrode and insulated from the first floating gate electrode; and a second memory cell transistor adjacent to the first memory cell transistor in a row direction of the matrix, the second memory cell transistor including: a second floating gate electrode provided on the substrate and insulated from the substrate and separated from the first floating gate electrode, an upper surface of the second floating gate electrode being larger than a lower surface of the second floating gate electrode, and the upper surface of the second floating gate electrode being lower than an upper surface of the first floating gate electrode; and a second control gate electrode provided on the second floating gate electrode and insulated from the second floating gate electrode.

Another aspect of the present invention inheres in A method for manufacturing a semiconductor memory including: forming a gate insulating film on a substrate; depositing a first conductive layer on the gate insulating film; dividing the first conductive layer so as to divide into first and second floating gate layers by forming a first groove extending in a column direction therebetween; decreasing a horizontal level of an upper surface of the second floating gate layer from a horizontal level of an upper surface of the first floating gate layer, and increasing the upper surface of the second floating gate layer so that the upper surface of the second floating gate layer is larger than a lower surface of the second floating gate layer; depositing an interelectrode insulating film on the first and second floating gate layers; depositing a second conductive layer on the interelectrode insulating film; forming a plurality of control gate electrodes, first floating gate electrodes and second floating gate electrodes by forming a second groove penetrating the second conductive layer, the interelectrode insulating film, and the first and second floating gate layers in a row direction; and forming source and drain regions in the substrate through the second groove.

DETAILED DESCRIPTION OF THE INVENTION

Figure 1:
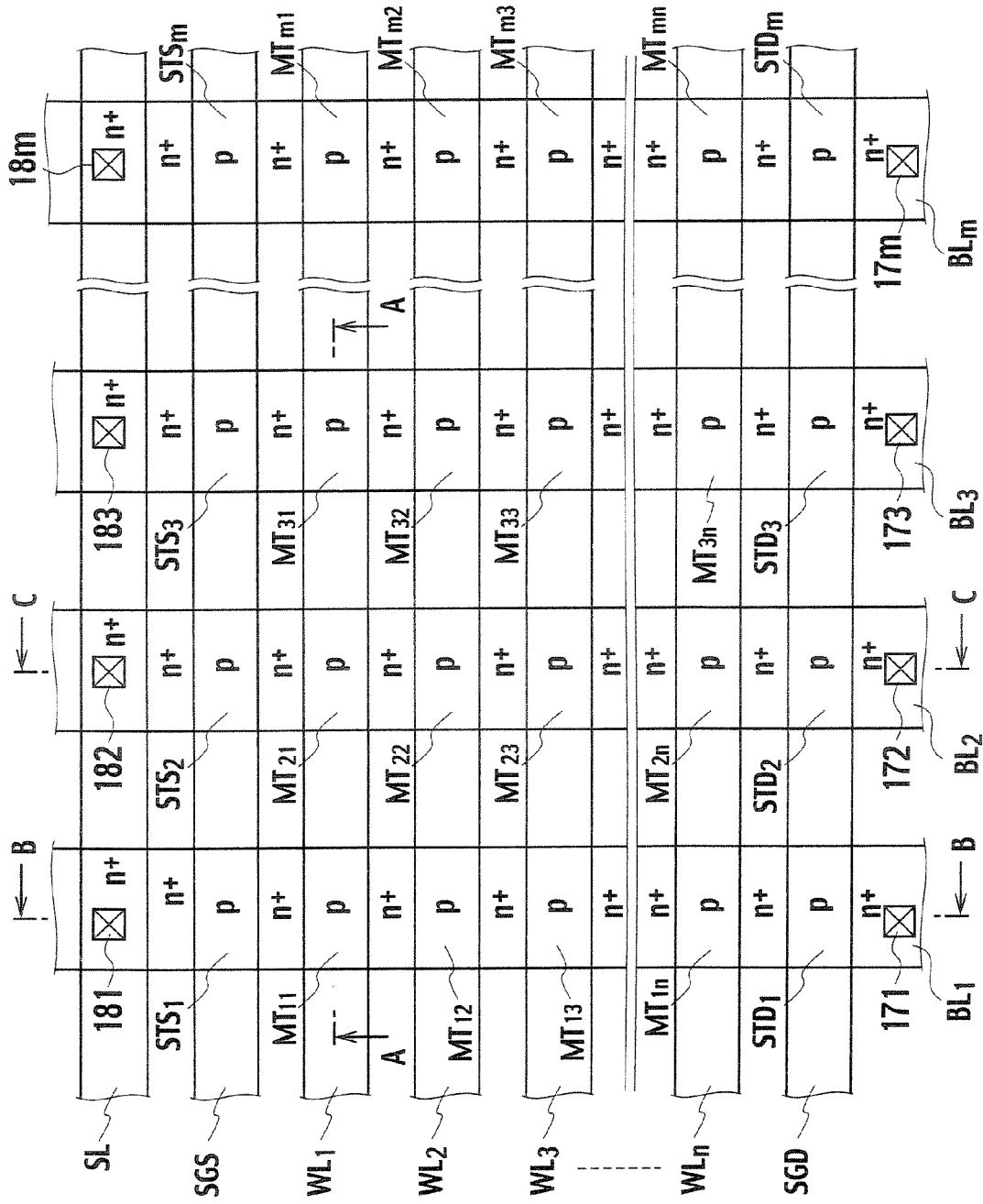
FIG. 1 is a plan view showing an example of a cell array of a non-volatile semiconductor memory according to an embodiment of the present invention.

An embodiment and various modifications of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

It is to be noted that the expressions, such as "first conductive layer", "second conductive layer", "third conductive layer", . . . , as used in this application does not define actual time procedures, but are used expediently for logic procedures.

As shown in FIG. 1, a non-volatile semiconductor memory according to the embodiment of the present invention is an NAND flash EEPROM in which a plurality of memory cell transistors $MT_{11}$ to $MT_{mn}$ are arranged in a matrix. FIG. 1 shows m×n (m and n are integers) memory cell transistors $MT_{11}$ to $MT_{1n}$, $MT_{21}$ to $MT_{2n}$, $MT_{31}$ to $MT_{3n}$, . . . , $MT_{mn}$ to $MT_{mn}$ provided in the matrix, as an example. As shown in FIG. 1, the following elements are arranged in the column direction (bit line direction) of a cell array: a source line SL connected to source line contact plugs 181, 182, 183, . . . , 18m; a select gate line SGS connected to select gate electrodes of select gate transistors $STS_1$, $STS_2$, $STS_3$, $STS_m$; word lines $WL_1$ to $WL_n$ connected to control gate electrodes of the respective memory cell transistors $MT_{11}$ to $MT_{1n}$; and a select gate line SGD connected to select gate electrodes of select gate transistors $STD_1$, $STD_2$, $STD_3$, . . . , $STD_m$. Bit lines $BL_1$, $BL_2$, $BL_3$, . . . , $BL_m$, connected to bit line contact plugs 171, 172, 173, . . . , 17m, are arranged in the row direction (word line direction) so as to extend in the column direction.

The non-volatile semiconductor memory according to the embodiment of the present invention further includes peripheral circuits, which are omitted from illustration, disposed on the semiconductor substrate 1 around the cell arrays configured by the plurality of memory cell transistors $MT_{11}$ to $MT_{1n}$, $MT_{21}$ to $MT_{2n}$, . . . , and $MT_{m1}$ to $MT_{mn}$.

Figure 2:
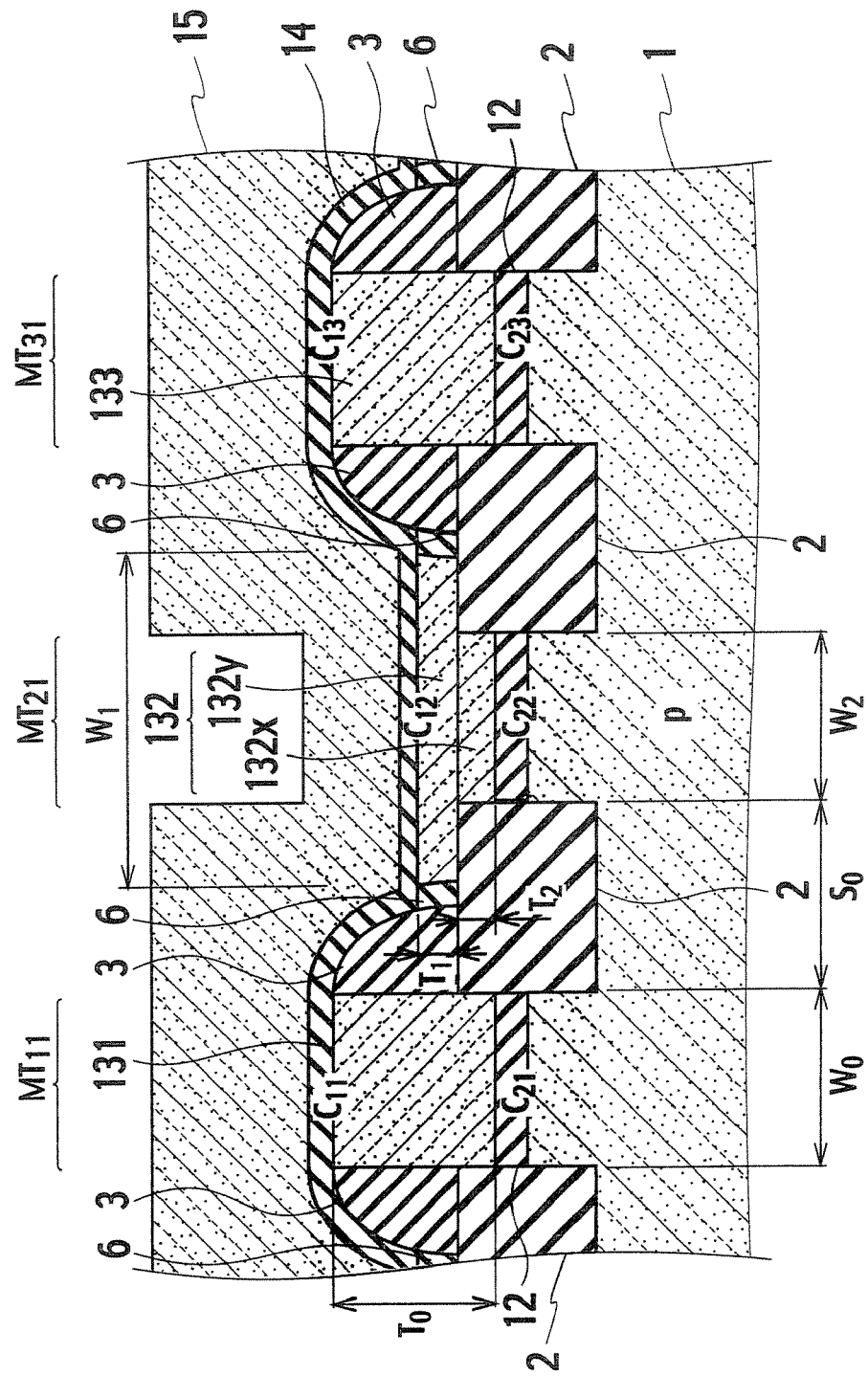
FIG. 2 is a cross-sectional view in a row direction showing the example of the cell array of the non-volatile semiconductor memory.

FIG. 2 is a cross sectional view taken along the A-A line in the row direction shown in FIG. 1. As shown in FIG. 2, the non-volatile semiconductor memory according to the embodiment of the present invention includes: a semiconductor substrate 1; first memory cell transistors $M_{11}$ and $M_{31}$ and a second memory cell transistor $M_{21}$ adjacent to the first memory cell transistors $M_{11}$ and $M_{31}$ in a row direction of the matrix. Each of the first memory cell transistors $M_{11}$ and $M_{31}$ includes: a first floating gate electrode 131 and 133 provided on the substrate 1 and insulated from the substrate 1; and a first control gate electrodes 15 provided on the first floating gate electrodes 131 and 133 and insulated from the first floating gate electrodes 131 and 133. The second memory cell transistor $M_{21}$ includes: a second floating gate electrode 132 provided on the substrate 1 and insulated from the substrate 1 and separated from the first floating gate electrodes 131 and 133, an upper surface of the second floating gate electrode 132 being larger than a lower surface of the second floating gate electrode 132, and the upper surface of the second floating gate electrode 132 is lower than an upper surface of the first floating gate electrodes 131 and 133; and a second control gate electrode 15 provided on the second floating gate electrode 132 and insulated from the second floating gate electrode 132

Figure 3:
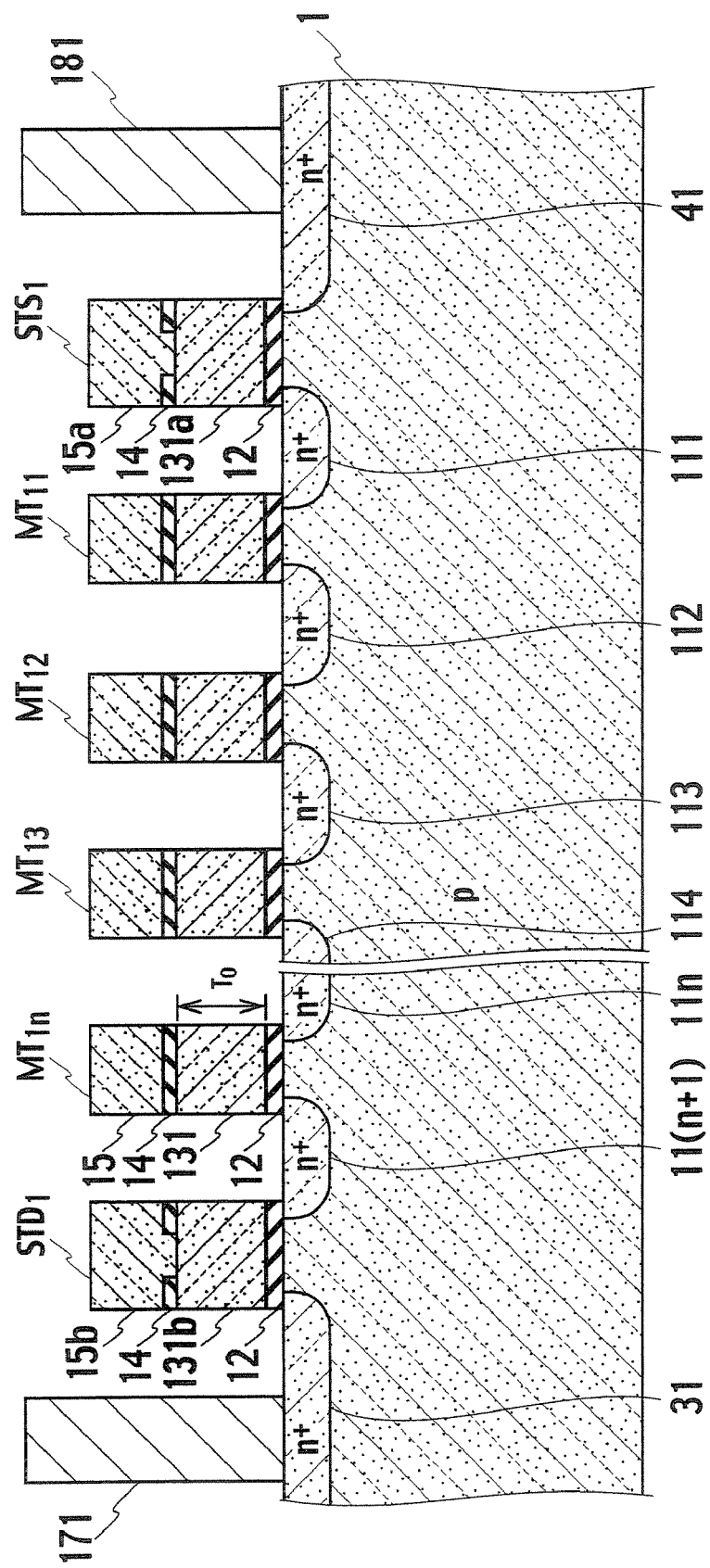
FIG. 3 is a cross-sectional view in a column direction showing the example of the cell array of the non-volatile semiconductor memory.

FIG. 3 is a cross-sectional view taken along the B-B line in the column direction shown in FIG. 1. As shown in FIG. 3, the memory cell transistors $MT_{11}$ to $MT_{1n}$ are arranged so as to be adjacent to one another in the column direction. Each of the memory cell transistors $MT_{11}$ to $MT_{1n}$ includes a stacked gate structure in which the floating gate electrode 131 and the control gate electrode 15 are stacked. For example, the memory cell transistor $MT_{11}$ includes: the source and drain regions 111 and 112 having $n^+$-type conductivity; the first floating gate electrode 131 provided on the channel region interposed between the source and drain regions 111 and 112 through the gate insulating film 12; and the control gate electrode 15 provided on the first floating gate electrode 131 through the interelectrode insulating films 14. The memory cell transistor $MT_{12}$ includes: the source and drain regions 112 and 113 having $n^+$-type conductivity; the first floating gate electrode 131 provided on the channel region interposed between the source and drain regions 112 and 113 through the gate insulating film 12; and the control gate electrode 15 provided on the first floating gate electrode 131 through the interelectrode insulating films 14. The memory cell transistor $MT_{13}$ includes: the source and drain regions 113 and 114 having $n^+$-type conductivity; the first floating gate electrode 131 provided on the channel region interposed between the source and drain regions 113 and 114 through the gate insulating film 12; and the control gate electrode 15 provided on the first floating gate electrode 131 through the interelectrode insulating films 14. The memory cell transistor $MT_{1n}$ includes: the source and drain regions $11n$ and $11(n+1)$ having $n^+$-conductivity; the first floating gate electrode 131 provided on the channel region interposed between the source and drain regions $11n$ and $11(n+1)$ through the gate insulating film 12; and the control gate electrode 15 provided on the first floating gate electrode 131 through the interelectrode insulating films 14.

The source and drain regions are shared by the memory cell transistors $MT_{11}$ to $MT_{1n}$ adjacent to each other in the column direction. "Shared region" refers to a common region which functions in a way that a source region for a memory cell transistor serves as a drain region for an adjacent memory cell transistor. For example, the drain region 112 of one memory cell transistor $MT_{11}$ serves as the source region 112 of an adjacent memory cell transistor $MT_{12}$.

Each of the memory cell transistors $Mt_{11}$ to $MT_{1n}$ is a MIS transistor. The "MIS transistor" is an insulated gate transistor, such as an insulated gate field effect transistor (MISFET) and an insulated gate static induction transistor (MISSIT), which controls channel current by gate voltage through an insulating film (gate insulating film) interposed between a gate electrode and a channel region. A MISFET in which a silicon oxide film ($SiO_2$ film) is used as a gate insulating film is referred to as a metal oxide semiconductor field effect transistor (MOSFET).

The thickness of the gate insulating film 12 of the memory cell transistors $MT_{11}$ to $MT_{1n}$ is approximately one nm to approximately twenty nm, and the thickness of the gate insulating film 12 is preferably about five to about ten nm. A silicon oxide film ($SiO_2$ film), silicon nitride ($Si_3N_4$), tantalum oxide ($Ta_2O_5$), titanium oxide ($TiO_2$), alumina ($Al_2O_3$), zirconium oxide ($ZrO_2$) and the like can be used as a material for the gate insulating film 12.

The thickness of the interelectrode insulating films 14 is about twice to about five times of the thickness of the gate insulating film 12, and the thickness of the interelectrode insulating films 14 is preferably about ten to about thirty nm. $Si_3N_4$, $Ta_2OS$, $TiO_2$, $Al_2O_3$, $ZrO_2$, oxide/nitride/oxide (ONO), phosphor silicate glass (PSG), boron phosphor silicate glass (BPSG), silicon oxide nitride (SiON), barium titanate ($BaTiO_3$), silicon oxide fluoride ($SiO_xF_x$), and organic resins, such as polyimide, can be used as materials for the inter-electrode insulating films 14. Furthermore, it is possible to adapt a stacked structure to combine these materials.

Each of a select gate transistor (first Select gate transistor) $STS_1$ and a select gate transistor (second select gate transistor) $STD_1$ is arranged in, and adjacent to, each end of the column direction of the memory cell transistors $MT_{11}$ to $MT_{1n}$.

The select gate transistor $STS_1$ is a MIS transistor. The select gate transistor $STS_1$ includes: an $n^+$ drain region 111 which is common to a source region 111 of the memory cell transistor $MT_{11}$ positioned in one end of the arrangement in the column direction; an $n^+$ source region 41; and select gate electrodes 131a and 15a arranged above a channel region with the gate insulating film 12 interposed between the drain region 111 and the source region 41. A source line contact plug 181 is arranged on the source region 41 so that the source line contact plug 18 is adjacent to the select gate transistor $STS_1$.

The select gate transistor $STD_1$ is a MIS transistor. The select gate transistor $STD_1$ includes: an $n^+$ source region 11 $(n+1)$ which is common to a drain region $11(n+1)$ of the memory cell transistor $MT_{1n}$ positioned in another end of the arrangement in the column direction; an $n^+$ drain region 31; and select gate electrodes 131b and 15b arranged above a channel region with the gate insulating film 12 interposed between the source region $11(n+1)$ and the drain region 31. A bit line contact plug 171 is arranged on the drain region 31 so that the bit line contact plug 171 is adjacent to the select gate transistor $STD_1$.

As shown in FIG. 2, in the row direction, the memory cell transistors $MT_{11}$, $MT_{21}$ and $MT_{31}$ are adjacent to one another. The memory cell transistors $MT_{11}$ and $MT_{31}$ include the first floating gate electrodes 131 and 133, respectively. On the other hand, the memory cell transistor $MT_{21}$ includes the second floating gate electrode 132.

The first isolation insulating film 2, the second isolation insulating film 3 and the third isolation insulating film 6 are buried between the first floating gate electrode 131 and the channel region of the memory cell transistor $MT_{11}$, the second floating gate electrode 132 and the channel region of the memory cell transistor $MT_{21}$, and the first floating gate electrode 133 and the channel region of the memory cell transistor $MT_{31}$. Elements of the respective memory cell transistors $MT_{11}$, $MT_{21}$ and $MT_{31}$ are completely isolated from one another by the first isolation insulating film 2, the second isolation insulating film 3 and the third isolation insulating film 6.

The first floating gate electrodes 131 and 133 have a rectangular cross-sectional shape. A thickness $T_0$ of the first floating gate electrodes 131 and 133 is in a range of approximately five to approximately 400 nm, and a width $W_0$ thereof is in a range of approximately five to approximately 400 nm. An aspect ratio of the first floating gate electrodes 131 and 133 is, for example, approximately ten as an upper limit, and preferably, approximately one to approximately five.

An upper surface of each of the first floating gate electrodes 131 and 133 and a part of a side surface thereof are opposite to the control gate electrode 15, thereby defining capacitances $C_{11}$ and $C_{13}$ between the control gate electrode 15 and the respective first floating gate electrodes 131 and 133. Moreover, a lower surface of each of the first floating gate electrodes 131 and 133 is opposite to the channel region, thereby defining capacitances $C_{21}$ and $C_{23}$ between the channel region and the respective first floating gate electrodes 131 and 133. Here, the area where the respective first floating gate electrodes 131 and 133 are opposite to the control gate electrode 15 is larger than the area where the respective first floating gate electrodes 131 and 133 are opposite to the channel region. Therefore, in the case where the inter-electrode insulating film 14 and the gate insulating film 12 are the same thickness and material, the capacitances $C_{11}$ and $C_{13}$ between the control gate electrode 15 and the respective first floating gate electrodes 131 and 133 can be increased more than the capacitances $C_{21}$ and $C_{23}$ between the channel region and the first floating gate electrodes 131 and 133.

The second floating gate electrode 132 has a T-shaped (convex) cross-sectional shape in a cross section taken along a direction (row direction) where the second floating gate electrode 132 is adjacent to the first floating gate electrodes 131 and 133. The second floating gate electrode 132 includes a lower member 132x, and an upper member 132y disposed on an upper surface of the lower member 132x. A width $W_2$ of the lower member 132x in the row direction is approximately in a range of five to 200 nm, and a thickness $T_2$ thereof is approximately in a range of two to 200 nm. A width $W_1$ of the upper member 132y is approximately in a range of five to 400 nm, which is wider than the width $W_2$, and a thickness $T_1$ thereof is approximately in a range of two to 200 nm. An aspect ratio of the second floating gate electrode 132 is, for example, approximately ten as an upper limit, and preferably, approximately one to approximately five.

An upper surface of the upper member 132y and the control gate electrode 15 are opposite to each other, thereby defining a capacitance $C_{12}$ between the upper member 132y and the control gate electrode 15. Moreover, a lower surface of the lower member 132x and the channel region are opposite to each other, thereby defining a capacitance $C_{22}$ between the lower member 132x and the channel region. Here, an area where the upper member 132y and the control gate electrode 15 are opposite to each other is larger than an area where the lower member 132x and the channel region are opposite to each other. Therefore, in the case where the inter-electrode insulating film 14 and the gate insulating film 12 are of the same thickness and material, the capacitance $C_{12}$ between the upper member 132y and the control gate electrode 15 can be increased more than the capacitance $C_{22}$ between the lower member 132x and the channel region.

Figure 4:
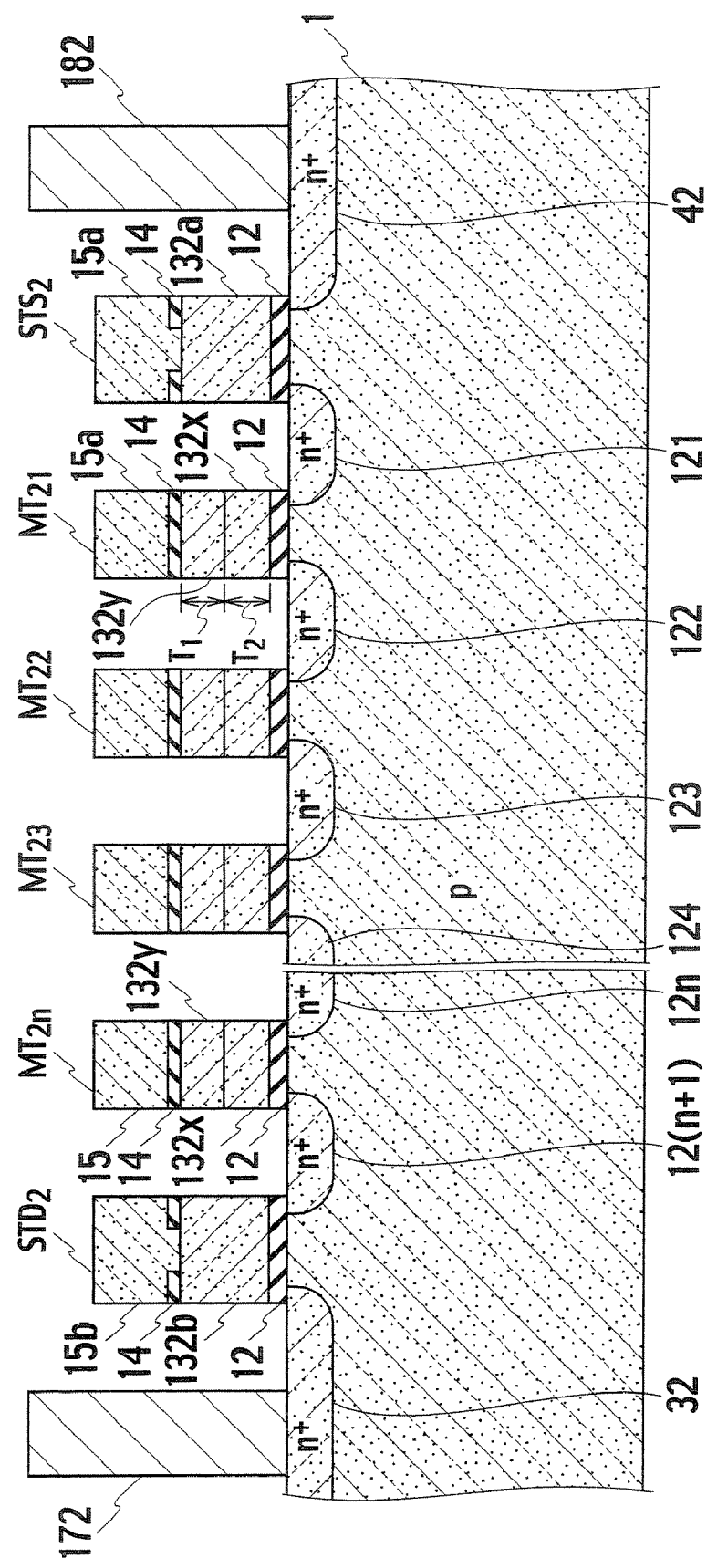
FIG. 4 is another cross-sectional view in the column direction showing the example of the cell array of the non-volatile semiconductor memory.

FIG. 4 is a cross-sectional view taken along the C-C line in the column direction shown in FIG. 1. The memory cell transistor $MT_{21}$ includes: the source and drain regions 121 and 122 having $n^+$-type conductivity; the second floating gate electrode 132 provided on the channel region interposed between the source and drain regions 121 and 122 through the gate insulating film 12; and the control gate electrode 15 provided on the second floating gate electrode 132 through the interelectrode insulating films 14. The memory cell transistor $MT_{22}$ includes: the source and drain regions 122 and 123 having $n^+$-type conductivity; the second floating gate electrode 132 provided on the channel region interposed between the source and drain regions 122 and 123 through the gate insulating film 12; and the control gate electrode 15 provided on the second floating gate electrode 132 through the interelectrode insulating films 14. The memory cell transistor $MT_{23}$ includes: the source and drain regions 123 and 124 having $n^+$-type conductivity; the second floating gate electrode 132 provided on the channel region interposed between the source and drain regions 123 and 124 through the gate insulating film 12; and the control gate electrode 15 provided on the second floating gate electrode 132 through the interelectrode insulating films 14. The memory cell transistor $MT_{2n}$ includes: the source and drain regions $12n$ and $12(n+1)$ having $n^+$-type conductivity; the second floating gate electrode 132 provided on the channel region interposed between the source and drain regions $12n$ and $12(n+1)$ through the gate insulating film 12; and the control gate electrode 15 provided on the second floating gate electrode 132 through the interelectrode insulating films 14.

Figure 5:
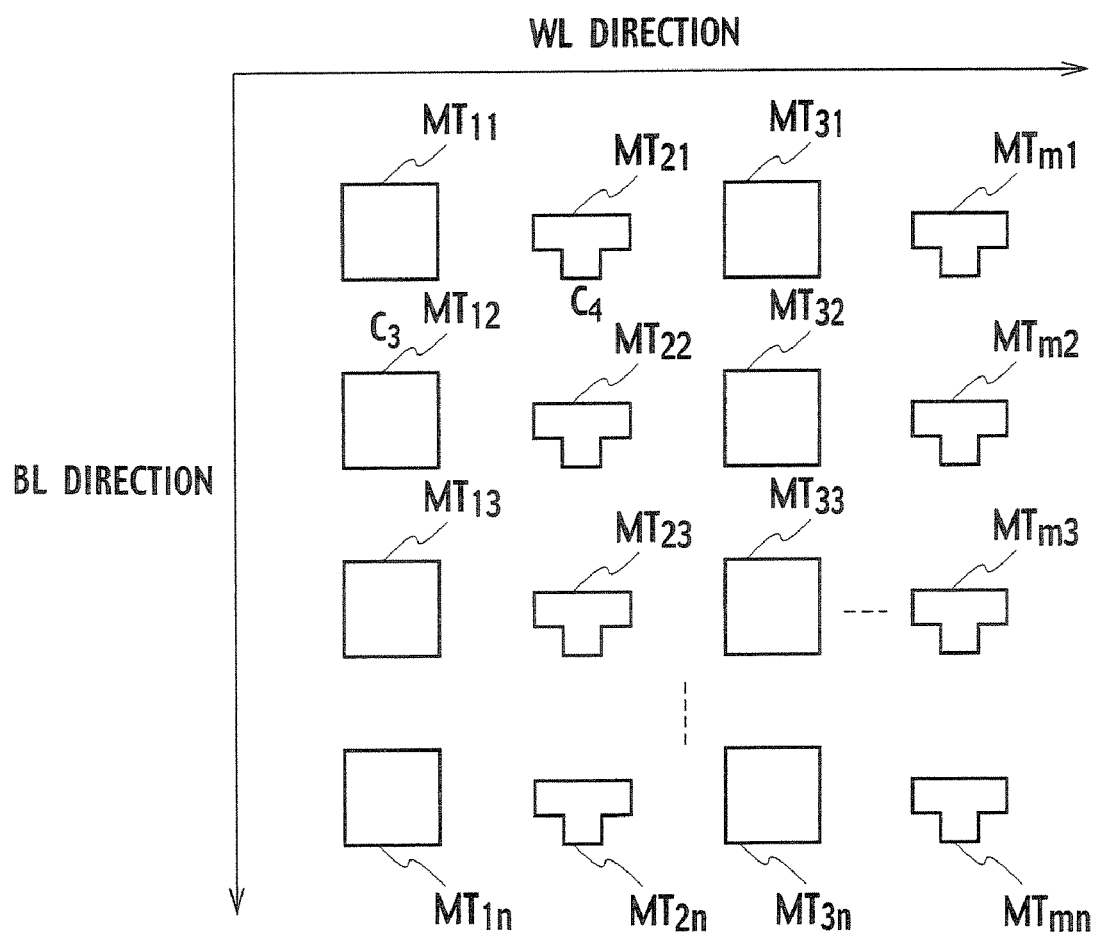
FIG. 5 is schematic view for explaining an arrangement of floating gate electrodes of the non-volatile semiconductor memory.

FIG. 5 shows an arrangement example of the first floating gate electrodes 131 and 133 and the second floating gate electrodes 132. A longitudinal axis in FIG. 5 represents a column direction (bit-line direction), and a lateral axis therein represents a row direction (word-line direction). Quadrangles in FIG. 5 show that the memory cell transistors defined thereby include the first floating gate electrodes 131 and 133. As shown by the T shapes (convex shapes) in FIG. 5, the memory cell transistors defined thereby include the second floating gate electrodes 132. In FIG. 5, for example, the memory cell transistors $MT_{11}$ to $MT_{1n}$, $MT_{31}$ to $MT_{3n}$ ... and $MT_{(m-1)1}$ to $MT_{(m-1)n}$ in the odd number columns include the first floating gate electrodes 131 and 133, and the memory cell transistors $MT_{21}$ to $MT_{2n}$, $MT_{41}$ to $MT_{4n}$ ..., and $MT_{m1}$ to $MT_{mn}$ in the even number columns include the second floating gate electrodes 132. Specifically, the plurality of first floating gate electrodes 131 and 133 and the plurality of second floating gate electrodes 132 are arranged in the row direction alternately and cyclically, thereby constituting a one-dimensional array.

Figure 6:
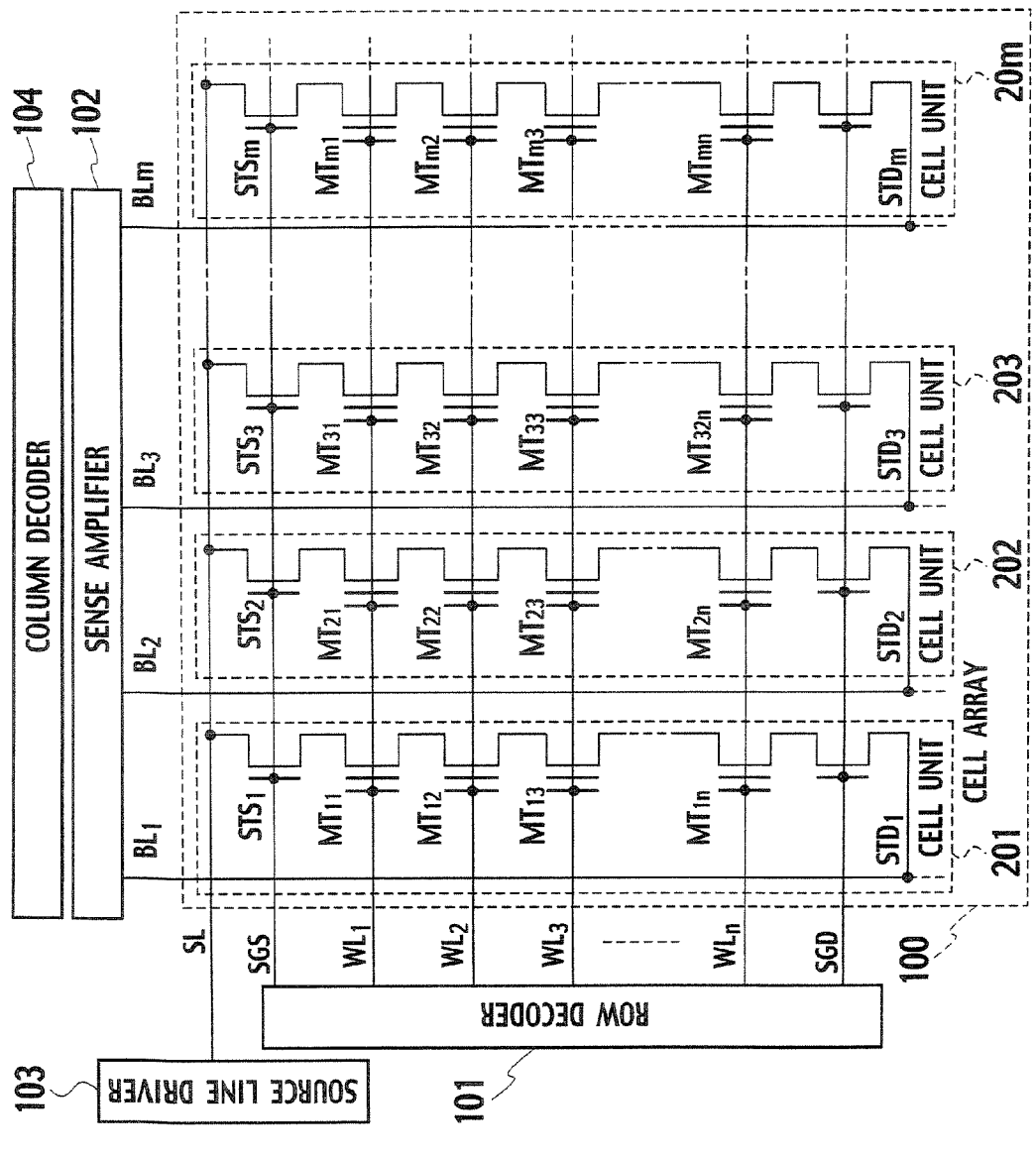
FIG. 6 is an equivalent circuit diagram showing the example of the cell array of the non-volatile semiconductor memory.

An equivalent circuit of the non-volatile semiconductor memory according to the embodiment shown in FIGS. 1 to 3 is shown in FIG. 6. As shown in FIG. 6, a cell array 100 includes the memory cell transistors $MT_{11}$ to $MT_{1n}$, $MT_{21}$ to $MT_{2n}$, ..., $MT_{m1}$ to $MT_{mn}$. In the cell array 100, the memory cell transistors $MT_{11}$ to $MT_{1n}$, and the select gate transistors $STS_1$ and $STD_1$ are connected in series, thereby comprising a cell unit (linear arrangement) 201. The select gate transistors $STS_2$ to $STS_m$, the memory cell transistors $MT_{21}$ to $MT_{2n}$, ..., $MT_{m1}$ to $MT_{mn}$, and the select gate transistors $STD_2$ to $STD_m$ are connected in series, thereby comprising cell units (linear arrangements) 201, 202, 203, 20m. The cell units 201, 202, 203, ..., 20m are respectively arranged in turn in the row direction, thereby forming a matrix.

In the cell unit 201, the drain region 111 of the select gate transistor $STS_1$ is connected to the source region 111 of the memory cell transistor $MT_{11}$ positioned at one end of the linear arrangement in which the group of memory cell transistors $MT_{11}$ to $MT_{1n}$ are connected in series. On the other hand, the source region $11(n+1)$ of the select gate transistor $STD_1$ is connected to the drain region $11(n+1)$ of the memory cell transistor $MT_{1n}$ positioned at the other end of the linear arrangement in which the group of memory cell transistors $MT_1$, to $MT_1$, are connected in series. Components of the cell units 202, 203, ..., 20m are the same as the cell unit 201.

The source regions of the respective select gate transistors $STS_1$ to $STS_m$ are connected with the source line SL common to the source regions. A source line driver 103, which supplies voltage to the source line SL, is connected to the source line SL. The following elements are connected to a row decoder 101: a select gate line SGS common to the select gate transistors $STS_1$ to $STS_m$; a select gate line SGD common to the select gate transistors $STD_1$ to $STD_m$; a word line $WL_1$ common to the memory cell transistors $MT_{11}, MT_{21}, \ldots, MT_{m1}$; a word line $WL_2$ common to the memory cell transistors $MT_{12}, MT_{22}, \ldots, MT_{m2}; \ldots$; and a word line $WL_n$ common to the memory cell transistors $MT_{1n}, MT_{2n}, \ldots, MT_{mn}$. The row decoder 101 obtains a row address decoded signal by decoding a row address signal, and supplies operation voltage to the word lines $WL_1$ to $WL_m$ and the select gate lines SGS and SGD, in a selective manner. Each of bit lines $BL_1$ to $BL_m$ is connected to the drain region of each of the select gate transistors $STD_1$ to $STD_m$. A sense amplifier 102 and a column decoder 104 are connected to the bit lines $BL_1$ to $BL_m$. The column decoder 104 obtains a column address decoded signal by decoding a column address signal, and selects one out of the bit lines $BL_1$ to $BL_m$, based on the column address decoded signal. The sense amplifier 102 amplifies memory signals, which have been read from a memory cell transistor selected by the row decoder 101 and the column decoder 104.

Figure 7:
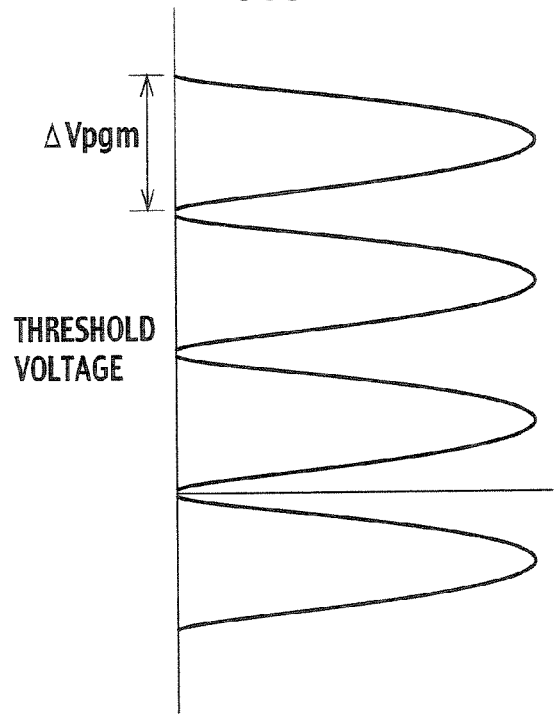
FIG. 7 is a graph showing an example of a threshold distribution of memory cell transistors of the non-volatile semiconductor memory.
Figure 8:
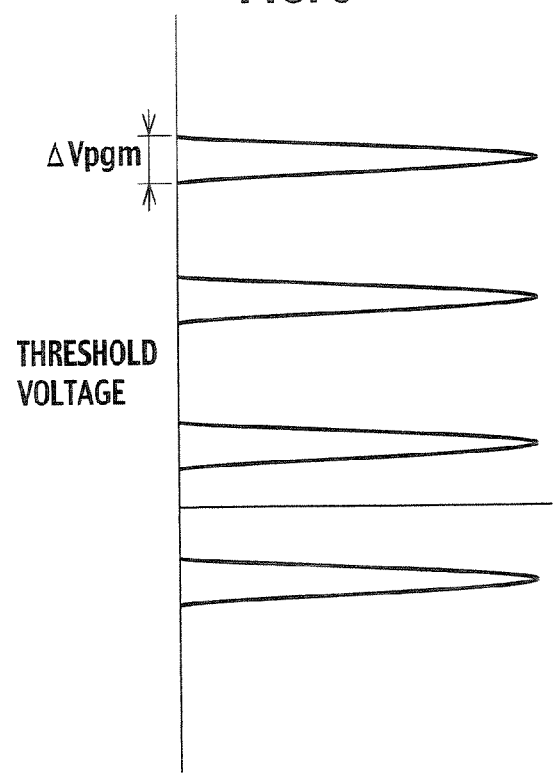
FIG. 8 is a graph showing another example of the threshold distribution of the memory cell transistors of the non-volatile semiconductor memory.

In the non-volatile semiconductor memory, multi-leveling of the memory cell transistors is performed by changing threshold voltages of the memory cell transistors. A write operation is performed for each of the word lines, and to one word line, actually, the several thousand to several hundred thousand of memory cell transistors are connected. FIG. 7 shows a distribution of thresholds of the respective values written into the memory cell transistors. In the case of applying a write voltage (program pulse) $V_{pp}$ to the control gate electrodes so as to reach desired threshold voltages, so as to performing the write operation, as shown in FIG. 7, a threshold distribution appears, in which variations of the threshold occur for each of the memory cell transistors. When a potential difference $\Delta V_{pgm}$ in the threshold distribution is large, the possibility of an erroneous read operation is increased. Accordingly, as shown in FIG. 8, it is preferable to have a small potential difference $\Delta V_{pgm}$.

As a reason for the occurrence of the variations of the threshold, variations resulting from the capacitances between the adjacent gates and variations in film thickness of the gate insulating films and variations in shape when forming the memory. If this occurs in the case of a write operation, the data is not written into all the memory cell transistors. Both cases occur depending on the data to be stored, where the data is written into the memory cell transistors adjacent to the memory cell transistor into which the data is to be written, and is not written thereinto. In the case where carriers are injected into the floating gate electrodes adjacent to the selected memory cell transistor described above, the selected memory cell transistor into which the data is to be written is affected by the memory cell transistors adjacent thereto. Therefore, even if the same write voltage $V_{pp}$ is applied, the selected memory cell transistor cannot sometimes reach the desired threshold voltage. Such an influence from the adjacent memory cell transistors increases in significance as the capacitance between the adjacent gates becomes larger and larger, and depends on the size of the areas of the floating gate electrodes of the adjacent memory cell transistors, which are opposite to the floating gate electrode of the selected memory cell transistor.

Figure 9:
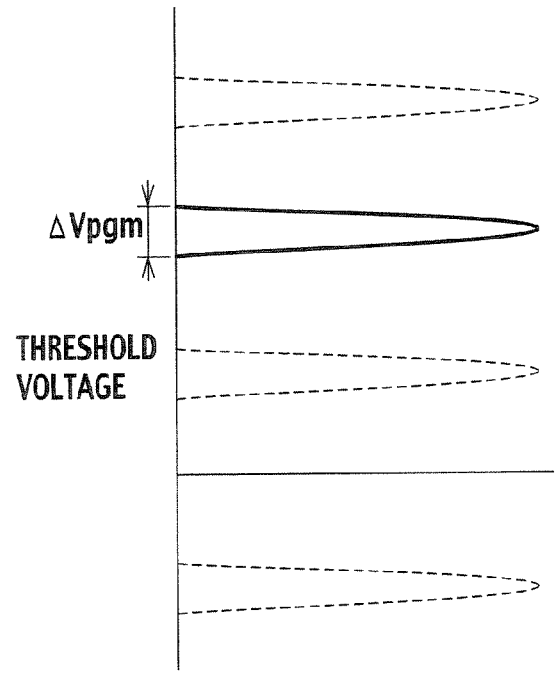
FIG. 9 is a graph showing further example of the threshold distribution of the memory cell transistors of the non-volatile semiconductor memory.
Figure 10:
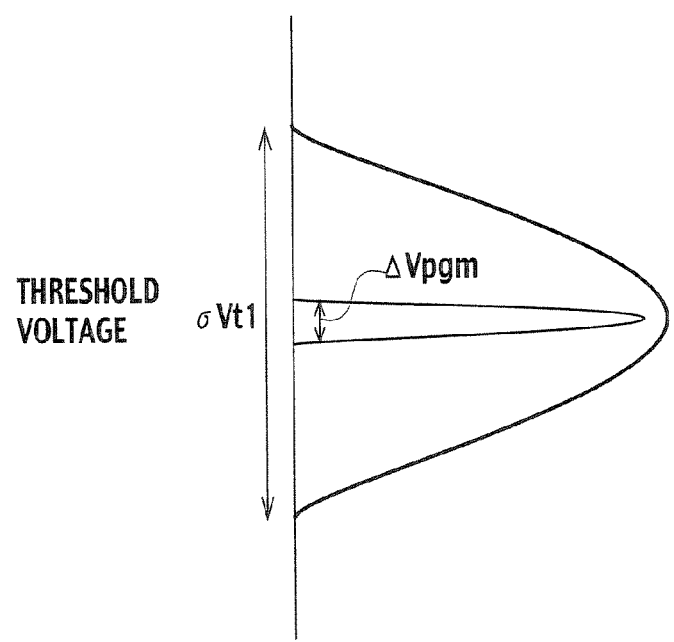
FIG. 10 is a graph showing further example of the threshold distribution of the memory cell transistors of the non-volatile semiconductor memory.

In the case of performing a write operation in such a threshold variation that remains in a threshold distribution shown by a solid line in FIG. 9, the capacitance between the adjacent gates is small, and no problem occurs if the threshold variation at one write operation remains within the threshold distribution. However, when the capacitance between the adjacent gates is large, the threshold distribution is varied by a potential difference $\sigma Vt_1$ as shown in FIG. 10.

When the threshold distribution is varied, in order to suppress the deterioration of the write accuracy owing to the influence from the capacitance between the adjacent gates, the write voltage $V_{pp}$ is applied so that the highest voltage value in the variation can be equal to or a little lower than a target threshold voltage, and a pulse to which the potential difference $\Delta V_{pp}$ is sequentially added is going to be applied so as to gradually increase the write voltage $V_{pp}$. The potential difference $\Delta V_{pp}$ can be represented by Equation (1) by using the potential difference $\sigma Vt_1$ and the potential difference $\Delta V_{pgm}$, which are dispersed by the write voltage $V_{pp}$ at a predetermined time.

$$\Delta V_{pp} = \sigma V_{t1} / \Delta V_{pgm} \quad (1)$$

A write time $T_{pgm}$ at a time per word line can be represented by Equation (2).

$$T_{pgm} = \Delta V_{pp} / T_{pptotal} \quad (2)$$

Here, a net time $T_{pptotal}$ taken to perform one write operation can be represented by Equation (3) by using a time $T_{write}$ taken to actually perform the write operation, a verification time $T_{verify}$ taken to check the threshold of the memory cell transistor which has performed the write, and a reset time $T_{reset}$.

$$T_{pptotal} = T_{write} + T_{verify} + T_{reset} \quad (3)$$

Figure 11:
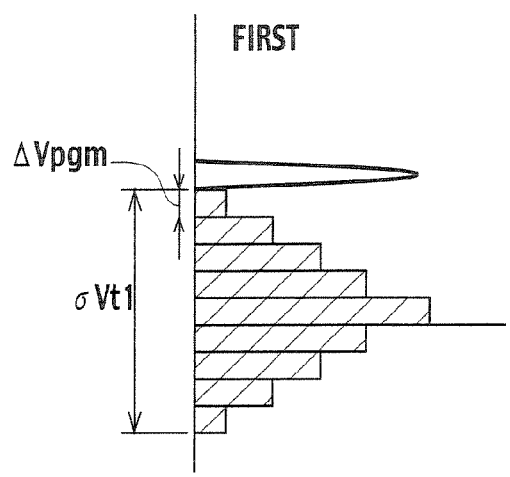
FIG. 11 is a graph explaining a first writing operation of a writing method of the non-volatile semiconductor memory.
Figure 12:
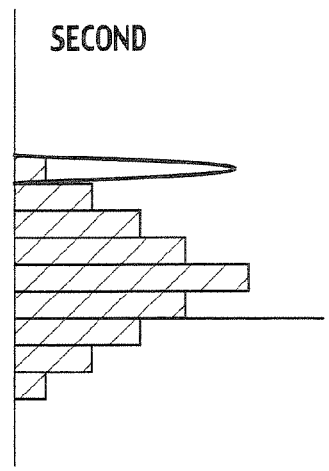
FIG. 12 is a graph explaining a second writing operation of the non-volatile semiconductor memory.
Figure 13:
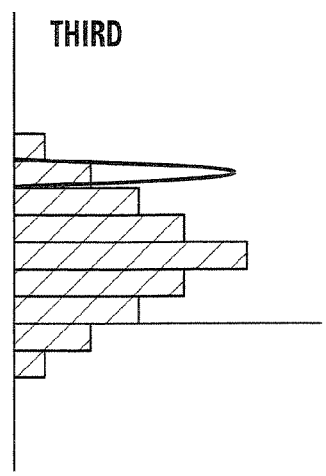
FIG. 13 is a graph for explaining a third writing operation of the non-volatile semiconductor memory.
Figure 14:
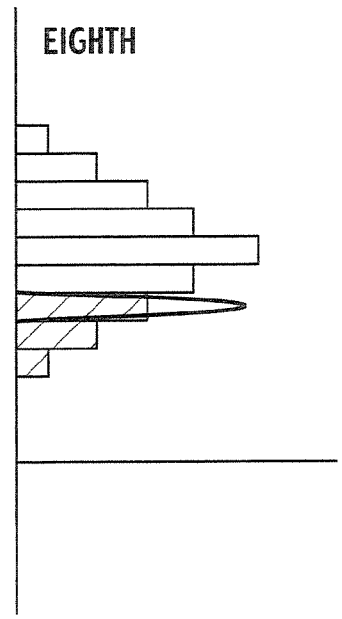
FIG. 14 is a graph for explaining an eighth writing operation of the non-volatile semiconductor memory.
Figure 15:
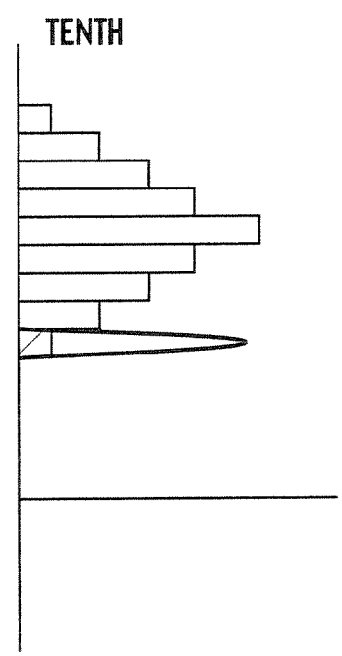
FIG. 15 is a graph for explaining a tenth writing operation of the non-volatile semiconductor memory.

After the first write voltage $V_{pp}$ is applied as shown in FIG. 11, a second write voltage $(V_{pp} + \Delta V_{pp})$ is applied as shown in FIG. 12. Then, a part of the threshold distribution shown by a diagonally shaded histogram remains within the desired threshold distribution. Subsequently, when a third write voltage $(V_{pp} + 2*\Delta V_{pp})$ is applied as shown in FIG. 13, a bias is not applied to the memory cell transistor which is shown by an outlined histogram and has remained within the desired threshold distribution. As shown in FIGS. 14 and 15, such a process as described above is repeated eight times and ten times, and thus the memory cell transistors having the threshold distributions shown by the diagonally shaded histogram can be made to remain within the potential difference $\Delta V_{pgm}$.

However, for example, if $T_{write}$ is approximately equal to 20 μs, $T_{verify}$ is approximately equal to 70 μs, and $T_{reset}$ is approximately equal to 20 μs, then $T_{pptotal}$ becomes 100 μs or more. As in this example, in the case of repeating the ten writes, it takes 1000 μs or more in total to complete the write operation for one word line WL.

Figure 16:
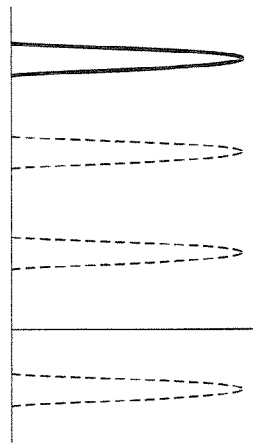
FIG. 16 is a graph for explaining another example of the writing method of the non-volatile semiconductor memory.
Figure 17:
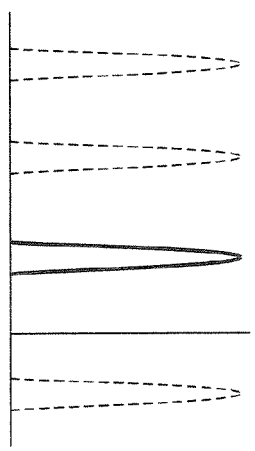
FIG. 17 is a graph explaining a first writing operation in the other example of the writing method of non-volatile semiconductor memory.
Figure 18:
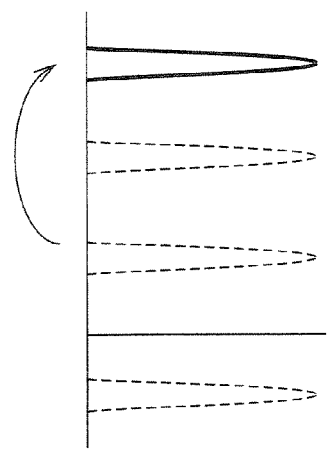
FIG. 18 is a graph for explaining a second wiring operation in the other example of the writing method of non-volatile semiconductor memory.

Next, a description will be made of a write method in the case of using a comparatively high value threshold from among the thresholds of the respective values of the memory cell transistor, as shown in FIG. 16. In the memory cell transistor in which the influence from the capacitance between the adjacent gates is large, the write operation is performed for a low value once, as shown in FIG. 17. Then the write operation is performed so that the threshold can be a desired value as shown in FIG. 18. In the case of writing the data as described above, the processes shown in FIG. 13 to FIG. 15 are individually performed in order that the memory cell transistor can remain within the threshold distributions shown in FIG. 17 and FIG. 18. Therefore, it takes much more time to complete the write operation.

As opposed to the above process, in accordance with the non-volatile semiconductor memory according to the embodiment of the present invention, as shown in FIG. 5, each second floating gate electrodes 132 is convex, and accordingly, a capacitance $C_4$ between the adjacent gates of the second floating gate electrode 132 is smaller than a capacitance $C_3$ between the adjacent gates of the first floating gate electrode 131. Hence, as compared with the case where quadrangle floating gate electrodes, which are entirely similar to the first floating gate electrode 131, are arrayed, the capacitances between the adjacent gates can be reduced. Hence, the processes shown in FIGS. 13 to 15 and the processes shown in FIGS. 17 and 18 can be simplified or omitted, thus making it possible to shorten the write time without deteriorating the write accuracy. In particular, in the case of writing the data into each second floating gate electrode 132, a write program simplified more than in the case of writing the data into each first control gate electrode 131 can be set.

Figure 19:
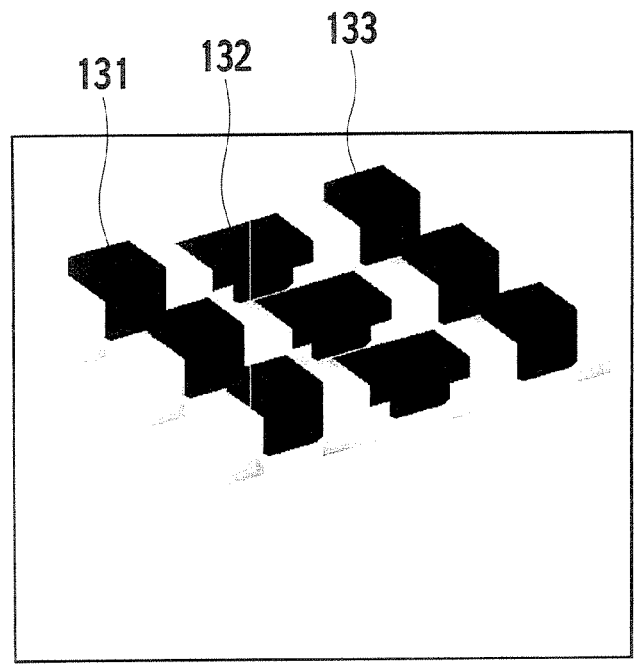
FIG. 19 is a squint view showing an example of a model used for an evaluation of the non-volatile semiconductor memory.
Figure 20:
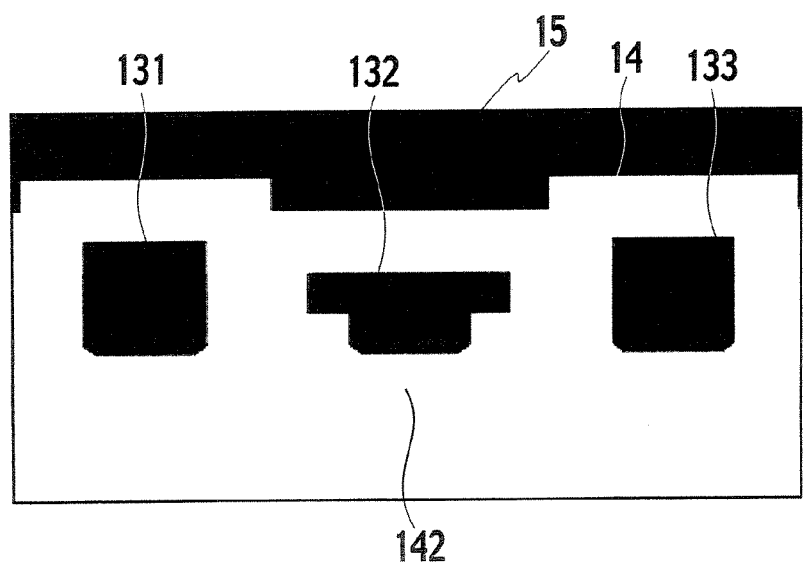
FIG. 20 is a cross-sectional view showing an example of a model of the non-volatile semiconductor memory.

Next, a description will be made of an evaluation method of a coupling ratio and the capacitance between the adjacent gates for the non-volatile semiconductor memory according to the embodiment of the present invention. The plurality of gates to be evaluated are input to a computer as a three-dimensional shape model as shown in FIGS. 19 and 20. A relative dielectric constant of the insulating material is input as a boundary condition. A voltage corresponding to an operating voltage is set for the control gate electrode to be studied. Under these conditions, the Poisson equation is numerically calculated from the distances between the respective gates, the shapes thereof, and the arrangement thereof by the computer, and electrostatic capacitances between the respective gates are calculated. Under a condition where, among the calculated electrostatic capacitances, the electrostatic capacitance between the control gate electrode and the floating gate electrode, to be studies, is defined as $C_1$, and the electrostatic capacitance between the control gate electrode to be studied and all the gate electrodes in the periphery thereof is defined as $C_2$, where the coupling ratio C is calculated by using Equation (4).

$$C=C_1/C_2 \times 100\% \qquad (4)$$

Moreover, the voltage ΔV, which is varied owing to the influence from the capacitance between the adjacent gates, is obtained by calculating voltage variations given to the memory cell transistor, under study, by voltage variations of the memory cell transistor adjacent thereto. In the calculation using the model shown in FIGS. 19 and 20, the coupling ratio was 40% or more, and the voltage ΔV was 580 mV or less.

Figure 21:
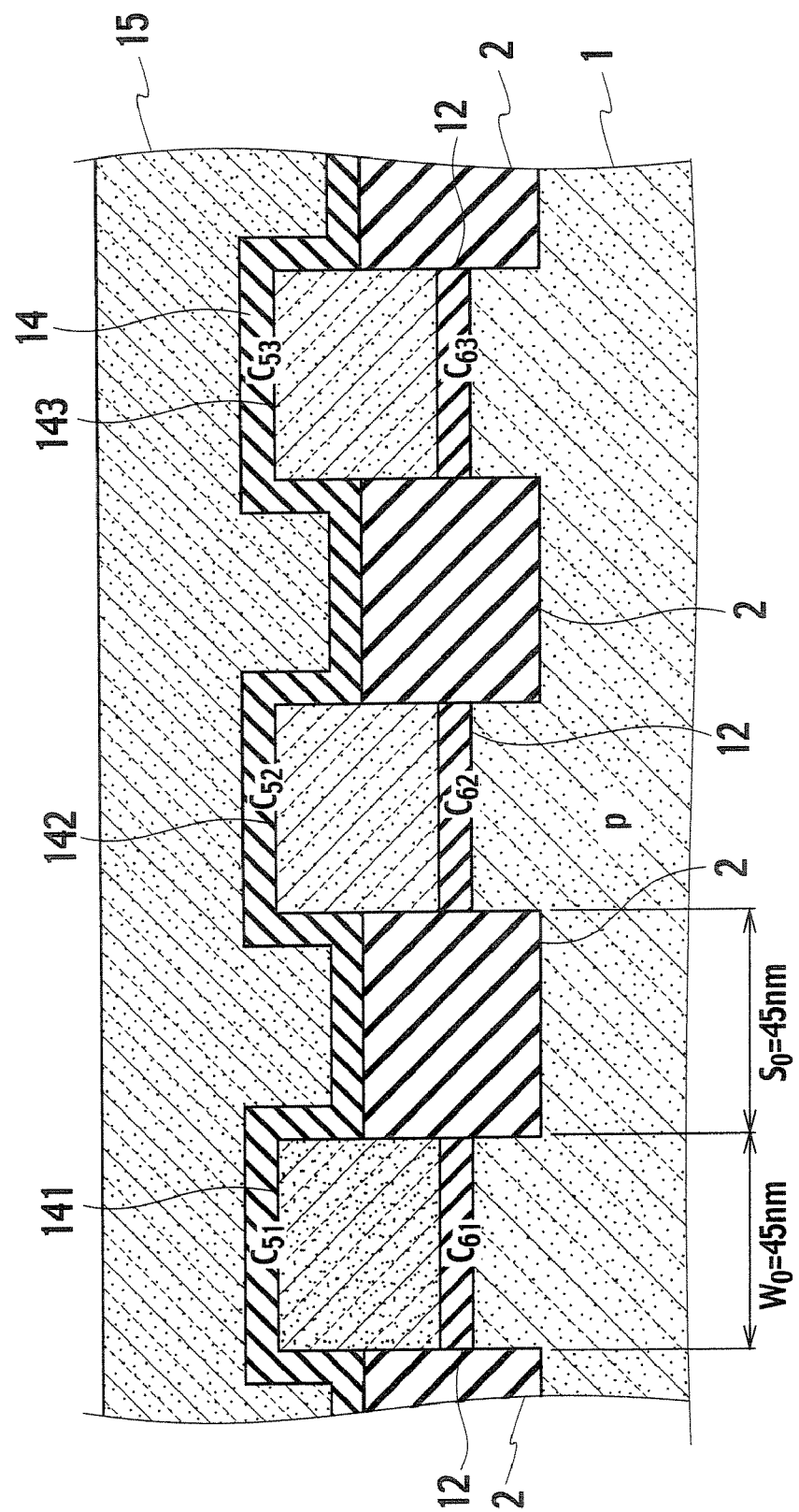
FIG. 21 is a cross-sectional view in the row direction showing a cell array of a non-volatile semiconductor memory according to a first comparison example.

Next, a description will be made of non-volatile semiconductor memories according to first to third comparative examples. The non-volatile semiconductor memory according to the first comparative example is shown in FIG. 21. In FIG. 21, the 45 nm rule is applied. Upper and partial side surfaces of floating gate electrodes 141, 142 and 143 and the control gate electrode 15 are opposite to each other, thereby defining capacitances $C_{51}$, $C_{52}$ and $C_{53}$. Lower surfaces of the floating gate electrodes 141, 142 and 143 and the channel region are opposite to each other, thereby defining capacitances $C_{61}$, $C_{62}$ and $C_{63}$. The side surfaces of the floating gate electrodes 141, 142 and 143 are also opposed to the control gate electrode 15. Thus, in the case where the inter-electrode insulating film 14 and the gate insulating film 12 are of the same thickness and material, the capacitances $C_{51}$, $C_{52}$ and $C_{53}$ between the floating gate electrodes 141, 142 and 143 and the control gate electrode 15 are increased more than the capacitances $C_{61}$, $C_{62}$ and $C_{63}$ between the floating gate electrodes 141, 142 and 143 and the channel region.

Figure 22:
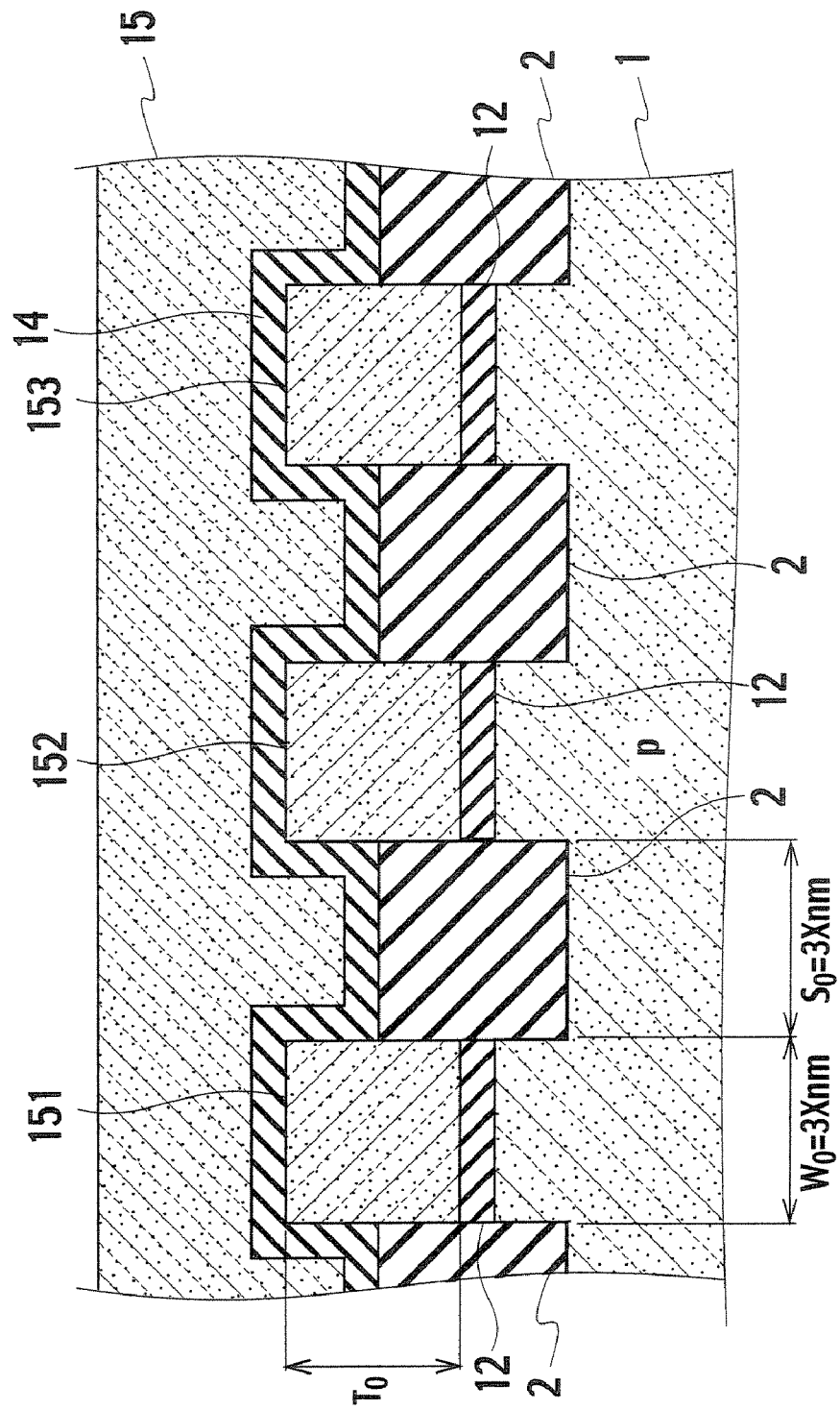
FIG. 22 is a cross-sectional view in the row direction showing a cell array of a non-volatile semiconductor memory according to a second comparison example.

The non-volatile semiconductor memory according to the second comparative example is shown in FIG. 22. In FIG. 22, the 3X nm rule (X is an arbitrary integer of 0 to 9) is applied in which the memory cell transistors are integrated/miniaturized more than in the 45 nm rule shown in FIG. 21. A distance between the floating gate electrodes 151, 152 and 153 adjacent to one another is $S_0$=3X nm, which is shorter than a distance $S_0$=45 nm between the floating gate electrodes 141, 142 and 143 shown in FIG. 21. Therefore, it is difficult to deposit the inter-electrode insulating film 14 with the minimum necessary film thickness of approximately ten to fifteen nm between the floating gate electrodes 151, 152 and 153, and further to embed the control gate electrode 15 thereon. Moreover, the distance $S_0$ between the adjacent gates is decreased, and the capacitances between the adjacent gates are thus increased. Therefore, the threshold of the memory cell transistor into which writing is not performed is varied due to the influence from the gate adjacent thereto, sometimes causing erroneous writing/reading operations.

Figure 23:
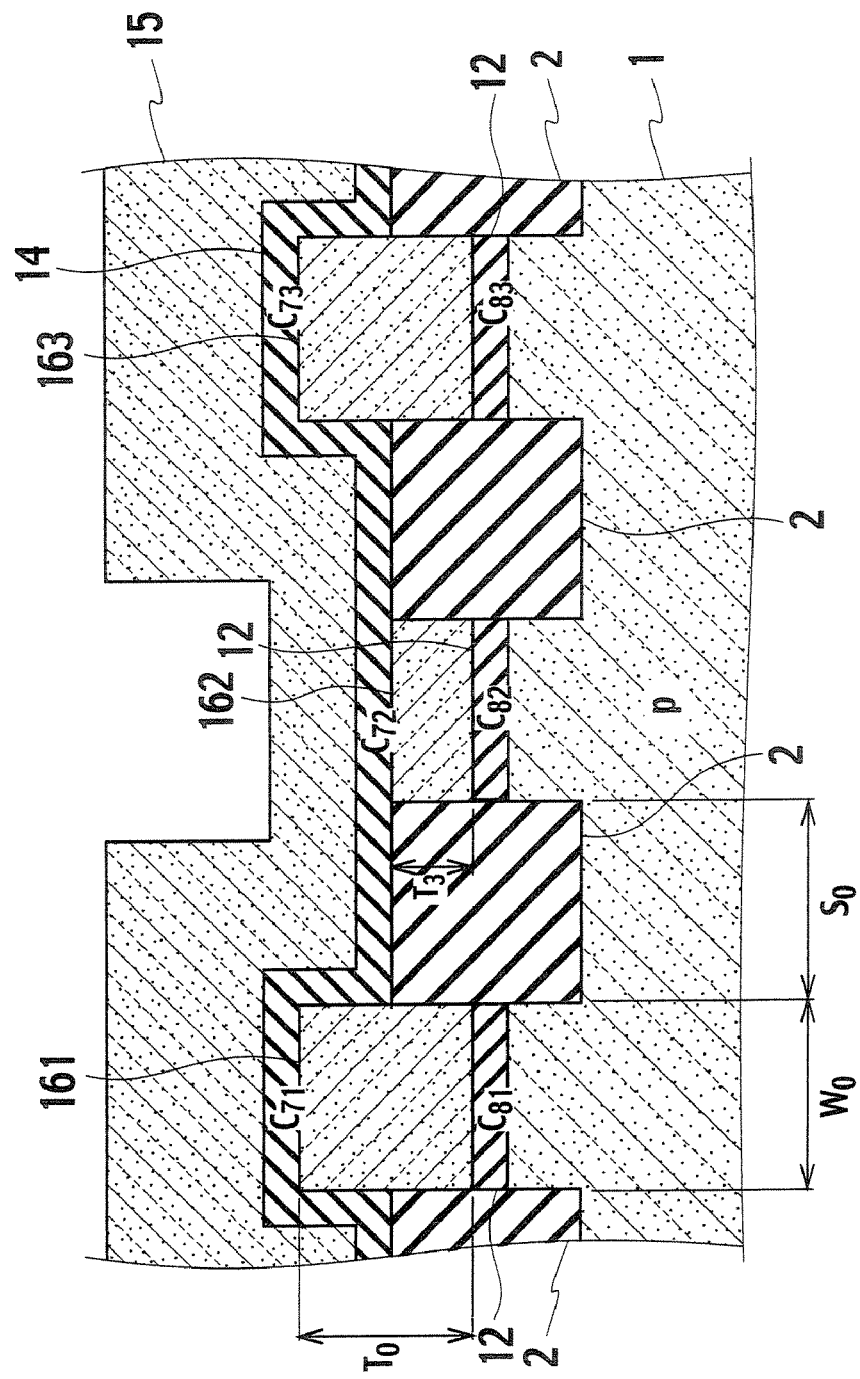
FIG. 23 is a cross-sectional view in the row direction showing a cell array of a non-volatile semiconductor memory according to a third comparison example.

The non-volatile semiconductor memory according to the third modification example is shown in FIG. 23. In FIG. 23, a horizontal level of the uppermost portion of the floating gate electrode 162 is lower than that of floating gate electrodes 161 and 163 adjacent thereto. Upper and partial side surfaces of the floating gate electrodes 161 and 163 and the control gate electrode 15 are opposite to each other, thereby defining capacitances $C_{71}$ and $C_{73}$. However, in the floating gate electrode 162, an upper surface thereof is opposite to the control gate electrode 15, thereby defining a capacitance $C_{72}$. Since widths of the upper surface and lower surface of the floating gate electrode 162 are substantially the same, the capacitance $C_{72}$ of the floating gate electrode 162 cannot be increased more than a capacitance $C_{82}$ of the gate insulating film 12.

As opposed to the first to third comparative examples shown in FIGS. 21 to 23, in accordance with the non-volatile semiconductor memory according to the embodiment of the present invention, even if the 3X nm rule is applied, as shown in FIG. 1, the capacitances $C_{11}$, $C_{12}$ and $C_{13}$ between the control gate electrode 15 and the respective first floating gate electrodes 131 and 133 and second floating gate electrode 132 can be increased more than the capacitances $C_{21}$, $C_{22}$ and $C_{23}$ between the channel region and the respective first floating gate electrodes 131 and 133 and second floating gate electrode 132.

Next, an example of a method for manufacturing the non-volatile semiconductor memory according to the embodiment of the present invention will be described. Here, FIGS. 24A, 25A, . . . , to 42A show a cross-sectional process flow of the cell array shown in FIG. 1 in the column direction taken along the A-A line. In addition, FIGS. 24B, 25B, . . . , to 42B show a cross-sectional process flow of the cell array in the row direction taken along the B-B line. Note that the method for manufacturing the non-volatile semiconductor memory shown in FIGS. 24A to 42B is an example. It is possible to provide the non-volatile semiconductor memory by other various methods.

Figure 24A:
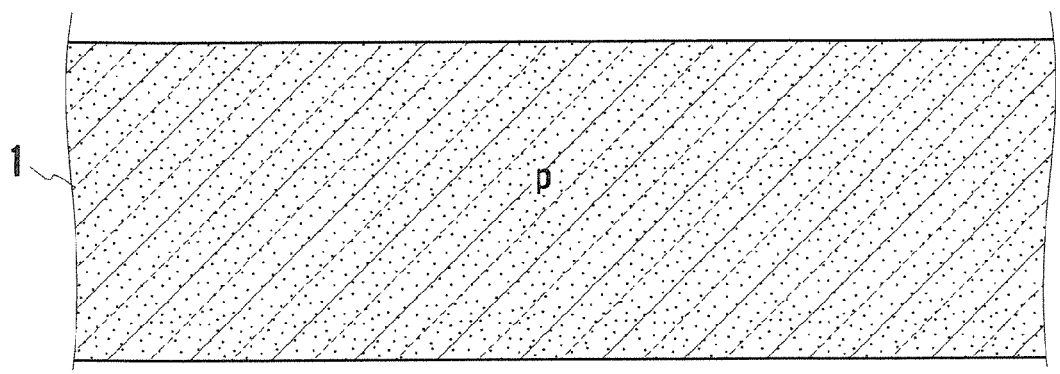
FIG. 24A is a cross-sectional view in the column direction showing an example of a method for manufacturing the non-volatile semiconductor memory.
Figure 24B:
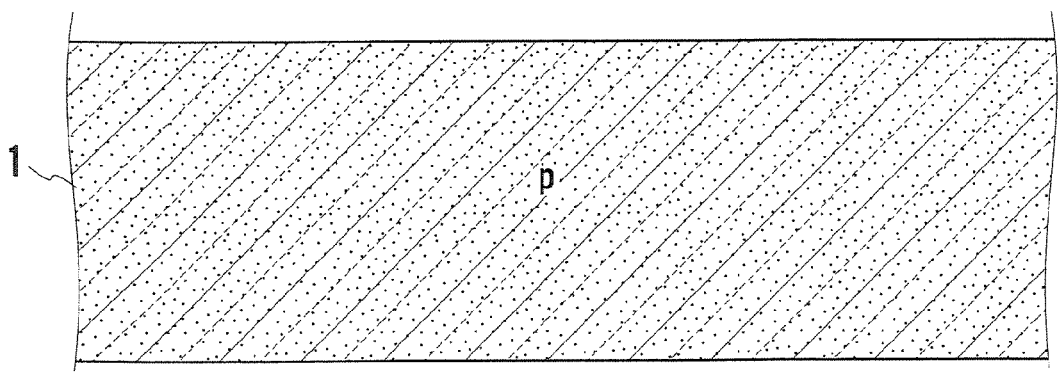
FIG. 24B is a cross-sectional view in the row direction showing an example of the method for manufacturing the non-volatile semiconductor memory.
Figure 25A:
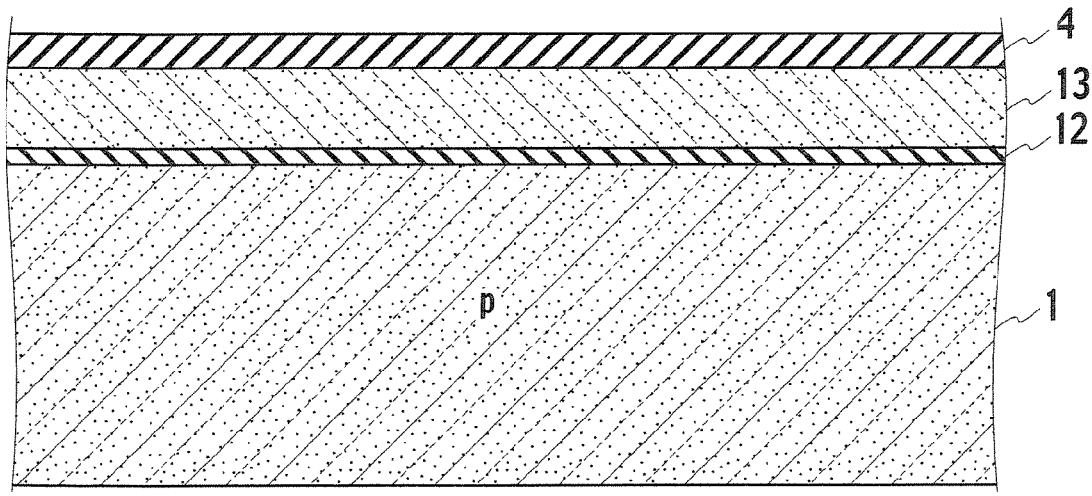
FIG. 25A is a cross-sectional view in the column direction after the process of FIG. 24A showing the method for manufacturing the non-volatile semiconductor memory.
Figure 25B:
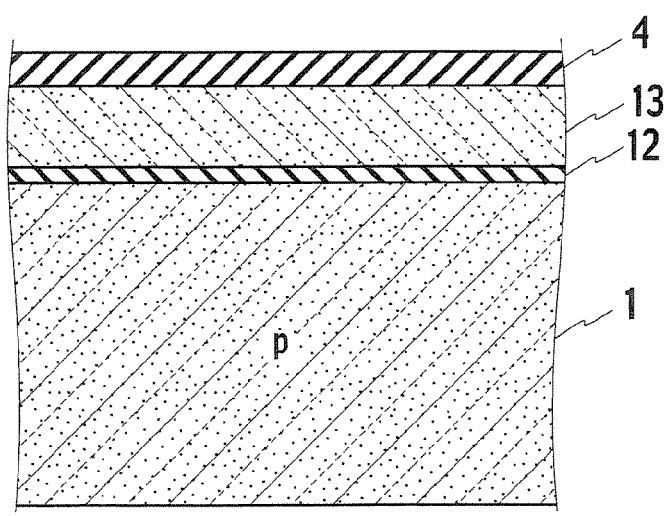
FIG. 25B is a cross-sectional view in the row direction after the process of FIG. 24B showing the method for manufacturing the non-volatile semiconductor memory.

As shown in FIGS. 24A and 24B, the substrate 1, such as p-type Si, is prepared. As shown in FIGS. 25A and 25B, a gate insulating film (tunnel oxidation film) 12, such as a $SiO_2$ film, is formed on a surface of the substrate 1 by thermal oxidation so that the thickness of the gate insulating film 12 is in a range of approximately one nm to 15 nm. A P-doped polysilicon layer (first conductive layer) 13, which will become floating gate electrodes, is deposited on the gate insulating film 12 by reduced pressurized CVD (RPCVD) so that the thickness of the polysilicon layer 13 may be in a range of about ten nm to about 200 nm. Subsequently, a mask film 4, such as a $Si_3N_4$ film of the like, is deposited on the polysilicon layer 13 by CVD so that the thickness of the mask film 4 may be approximately 50 nm to approximately 200 nm.

Figure 26A:
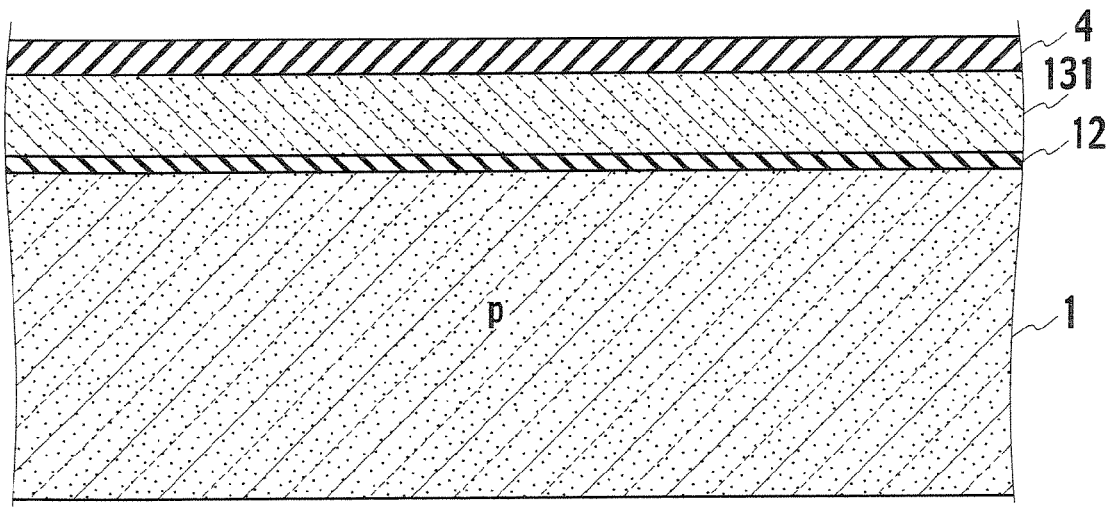
FIG. 26A is a cross-sectional view in the column direction after the process of FIG. 25A showing the method for manufacturing the non-volatile semiconductor memory.
Figure 26B:
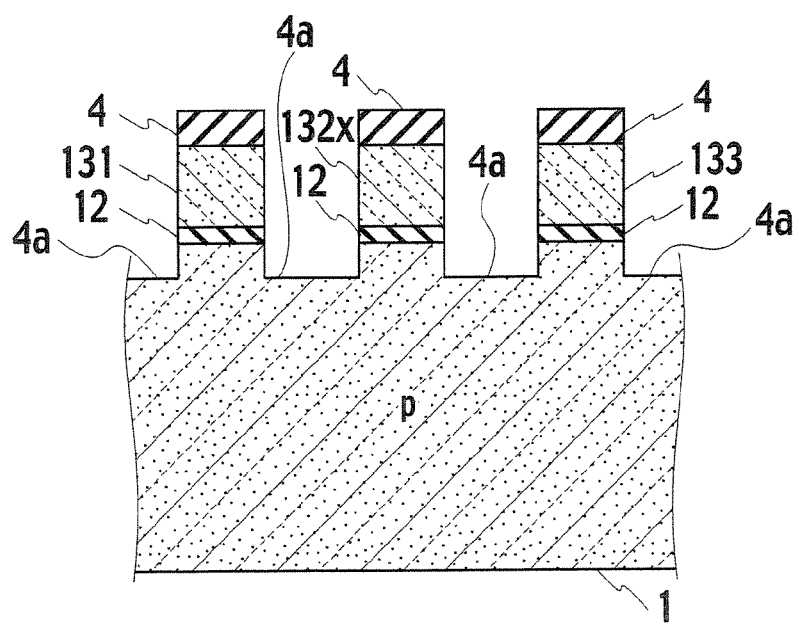
FIG. 26B is a cross-sectional view in the row direction after the process of FIG. 25B showing the method for manufacturing the non-volatile semiconductor memory.

A resist film is spin-coated on the mask film 4, and an etching mask of the resist film is formed by lithography. Parts of the mask film 4 are removed in a selective manner by reactive ion etching (RIE) in which an etching mask is used. After etching, the resist film is removed. With the mask film 4 used as a mask, parts of each of the polysilicon layer 13, the gate insulating film 12 and the substrate 1 are selectively removed in the column direction. As a result, groove portions (first groove portions) 4a are formed which extend in the column direction so as to penetrate through the polysilicon layer 13 and the gate insulating film 12, as shown in FIGS. 26A and 26B. Therefore, the first floating gate layers 131 and 133, which are parts of the polysilicon layer 13, and the second floating gate layer 132x, which is another part of the polysilicon layer 13 and separated from the first floating gate layers 131 and 133, are formed.

Figure 27A:
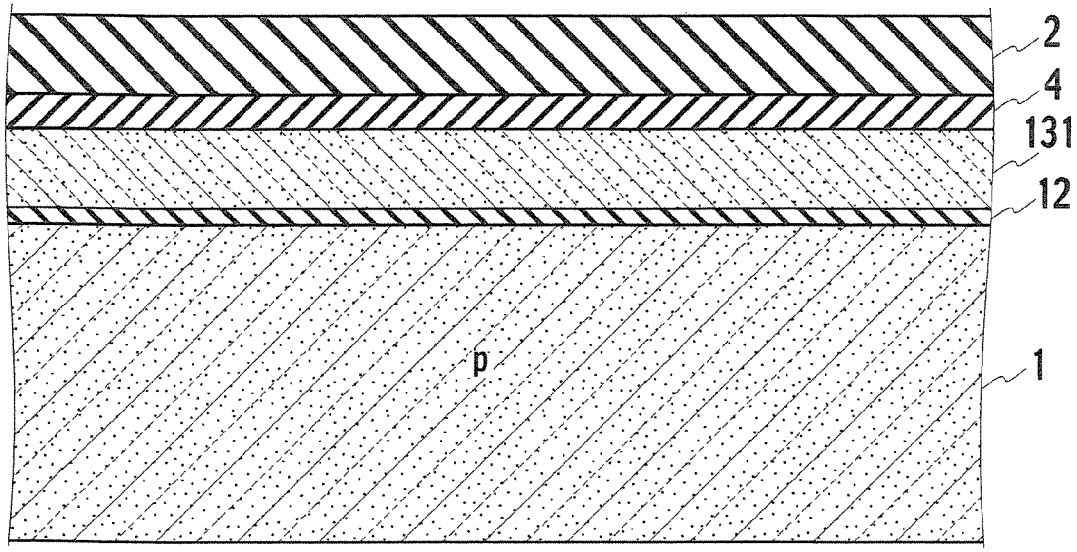
FIG. 27A is a cross-sectional view in the column direction after the process of FIG. 26A showing the method for manufacturing the non-volatile semiconductor memory.
Figure 27B:
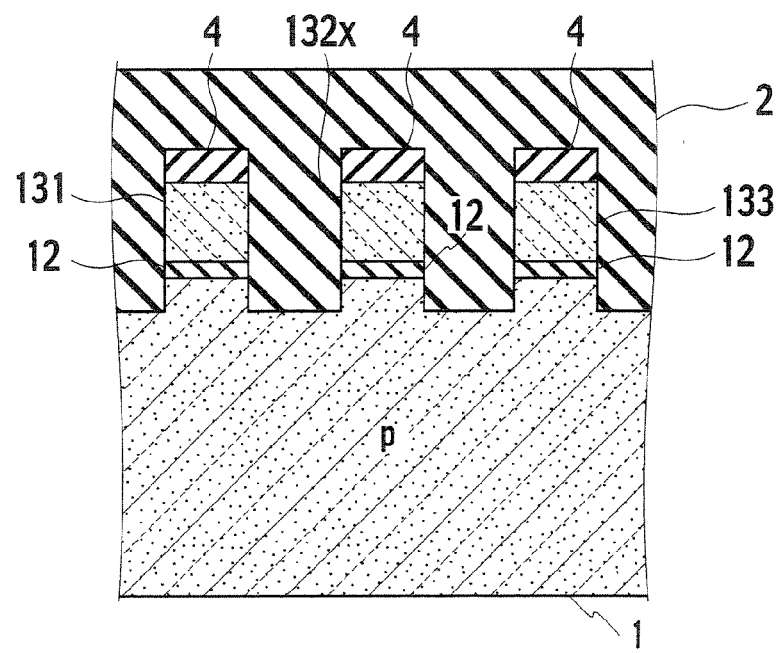
FIG. 27B is a cross-sectional view in the row direction after the process of FIG. 26B showing the method for manufacturing the non-volatile semiconductor memory.
Figure 28A:
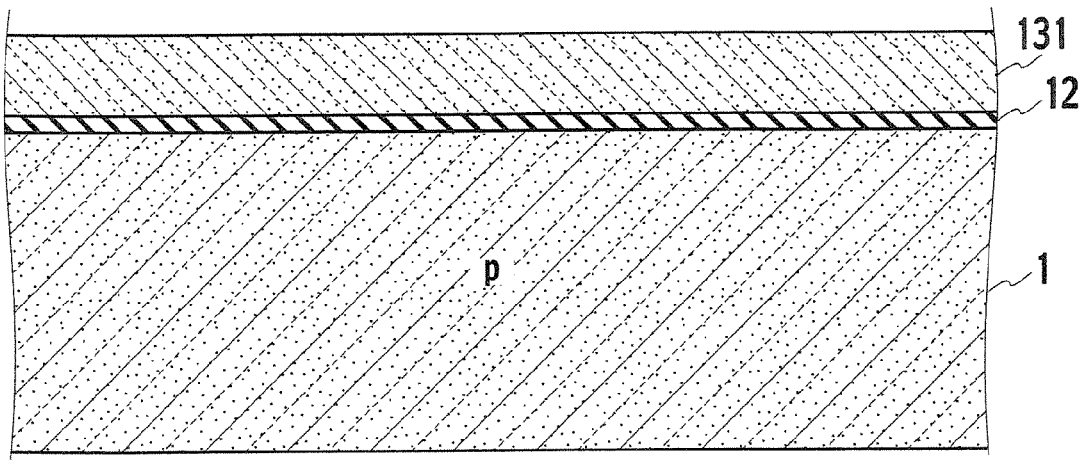
FIG. 28A is a cross-sectional view in the column direction after the process of FIG. 27A showing the method for manufacturing the non-volatile semiconductor memory.
Figure 28B:
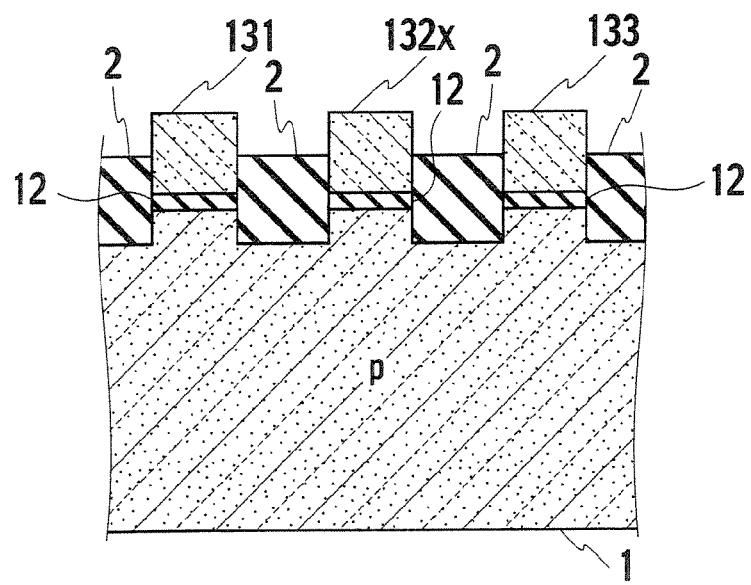
FIG. 28B is a cross-sectional view in the row direction after the process of FIG. 27B showing the method for manufacturing the non-volatile semiconductor memory.

Next, as shown in FIGS. 27A and 27B, a first element isolation insulating film 2 is buried in the groove portions 4a by CVD or the like so that the thickness of the element isolation insulating film 2 is approximately 200 nm to approximately 1,500 nm. Note that, after removing the mask film 4 shown in FIGS. 26A and 26B, the first isolation insulating film 2 may be buried. Then, as shown in FIGS. 28A and 28B, the mask film 4 and parts of the first isolation insulating film 2 are selectively removed by selectivity etching. Here, a horizontal level of the upper surface of the first isolation insulating film 2 is lower than a horizontal level of the upper surfaces of the first floating gate layers 131 and 133 and of the second floating gate layer 132x.

Figure 29A:
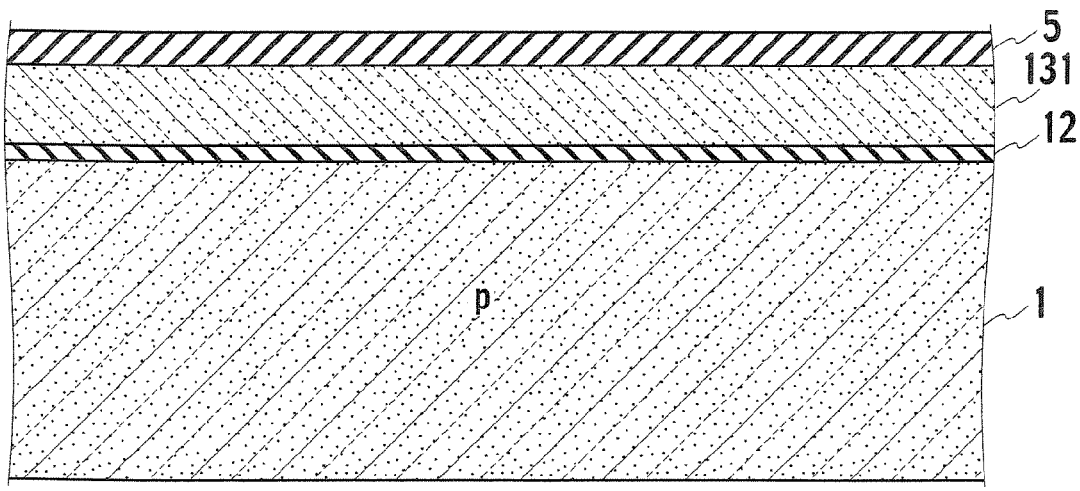
FIG. 29A is a cross-sectional view in the column direction after the process of FIG. 28A showing the method for manufacturing the non-volatile semiconductor memory.
Figure 29B:
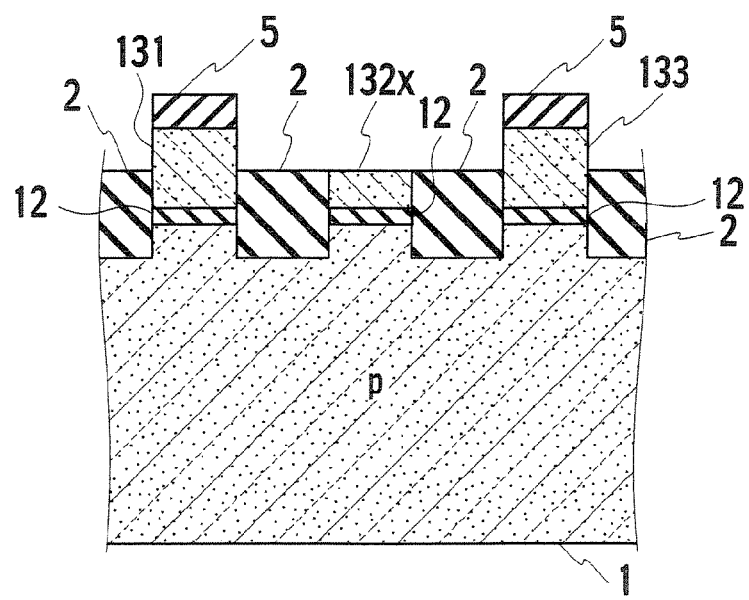
FIG. 29B is a cross-sectional view in the row direction after the process of FIG. 28B showing the method for manufacturing the non-volatile semiconductor memory.

Subsequently, a mask material 5, such as a $Si_3N_4$ film, is deposited by CVD or the like on the first isolation insulating film 2 and the first floating gate layers 131 and 133 and the second floating gate layer 132x. A resist film is spin-coated on the mask material 5, and an etching mask of the resist film is formed by a lithographic technique. Parts of the mask material 5 are removed in a selective manner by reactive ion etching (RIE) in which an etching mask is used. After etching, the resist film is removed. With the mask film 5 used as a mask, a part of the second floating gate layer 132x is removed in a selective manner. As a result, as shown in FIGS. 29A and 29B, the second floating gate layer (the lower member) 132x is formed. Thereafter, the mask film 5 is removed.

Figure 30A:
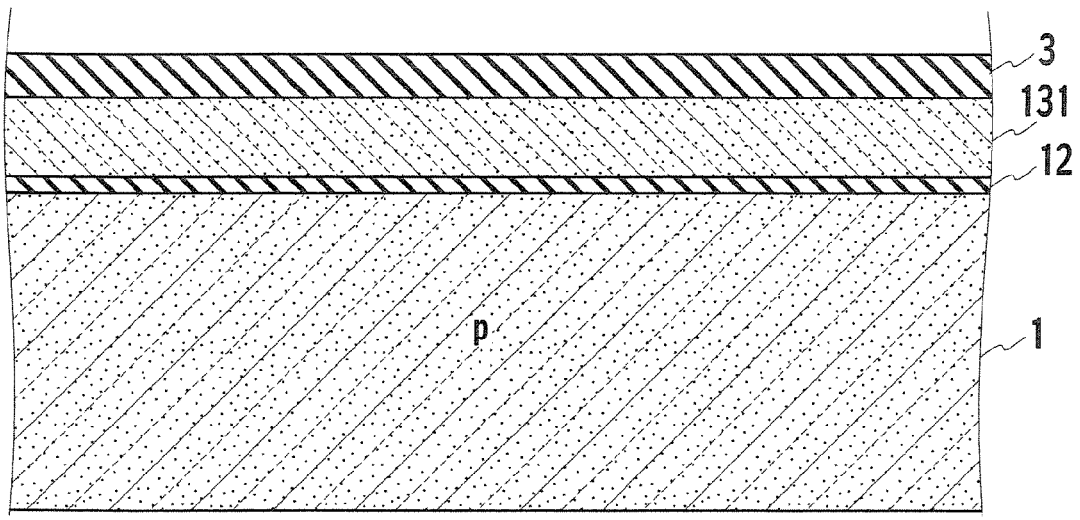
FIG. 30A is a cross-sectional view in the column direction after the process of FIG. 29A showing the method for manufacturing the non-volatile semiconductor memory.
Figure 30B:
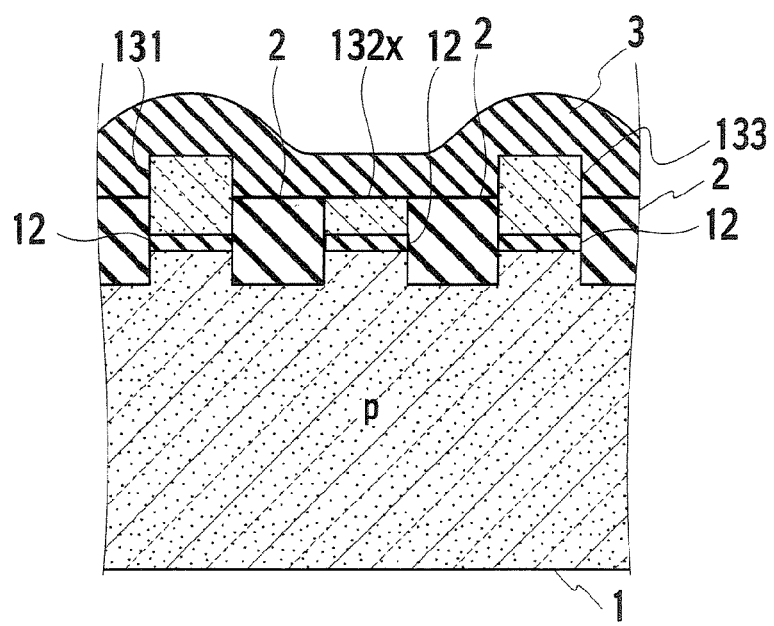
FIG. 30B is a cross-sectional view in the row direction after the process of FIG. 29B showing the method for manufacturing the non-volatile semiconductor memory.
Figure 31A:
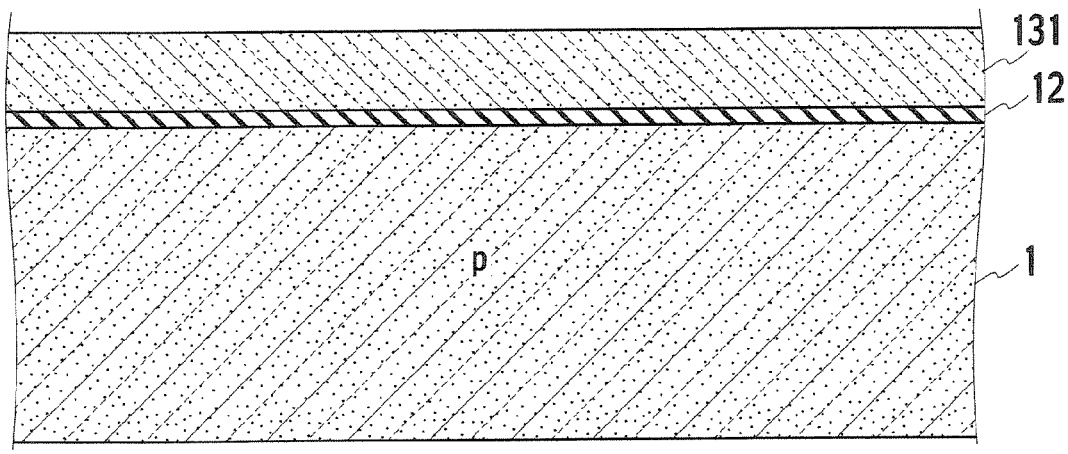
FIG. 31A is a cross-sectional view in the column direction after the process of FIG. 30A showing the method for manufacturing the non-volatile semiconductor memory.
Figure 31B:
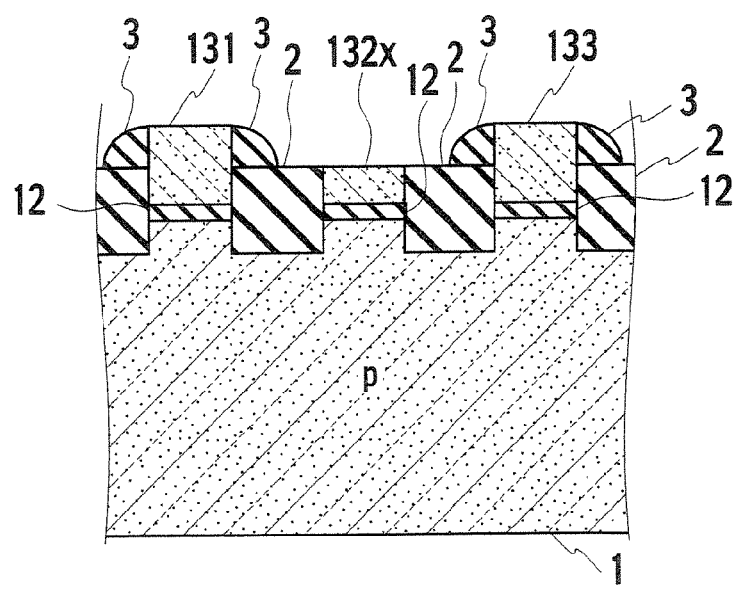
FIG. 31B is a cross-sectional view in the row direction after the process of FIG. 30B showing the method for manufacturing the non-volatile semiconductor memory.

Next, as shown in FIGS. 30A and 30B, the second isolation insulating film 3, such as a $SiO_2$ film or a $Si_3N_4$ film, is deposited by CVD or the like on the first isolation insulating film 2, the first floating gate layers 131 and 133 and the second floating gate layer 132x. As shown in FIGS. 31A and 31B, the second isolation insulating film 3 is etched back by RIE or the like. As a result, the upper surfaces of the first floating gate layers 131 and 133 and the second floating gate layer (the lower member) 132x are exposed. The second isolation insulating film 3 is retained on the side walls of the first floating gate layers 131 and 133.

Figure 32A:
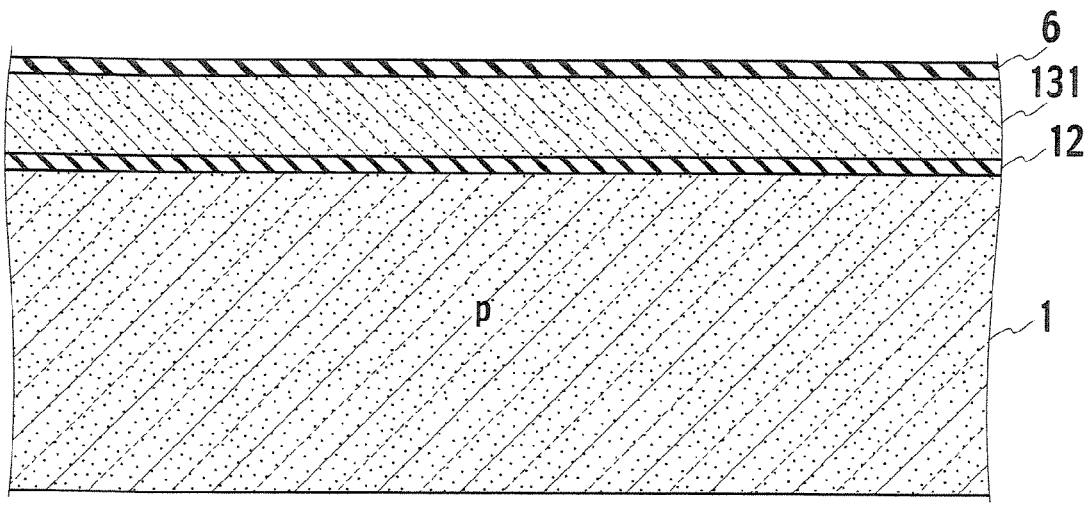
FIG. 32A is a cross-sectional view in the column direction after the process of FIG. 31A showing the method for manufacturing the non-volatile semiconductor memory.
Figure 32B:
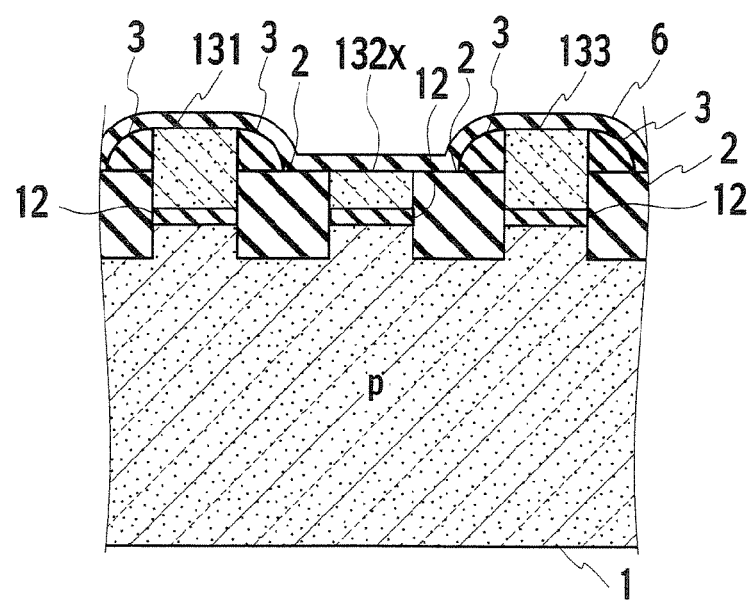
FIG. 32B is a cross-sectional view in the row direction after the process of FIG. 31B showing the method for manufacturing the non-volatile semiconductor memory.
Figure 33A:
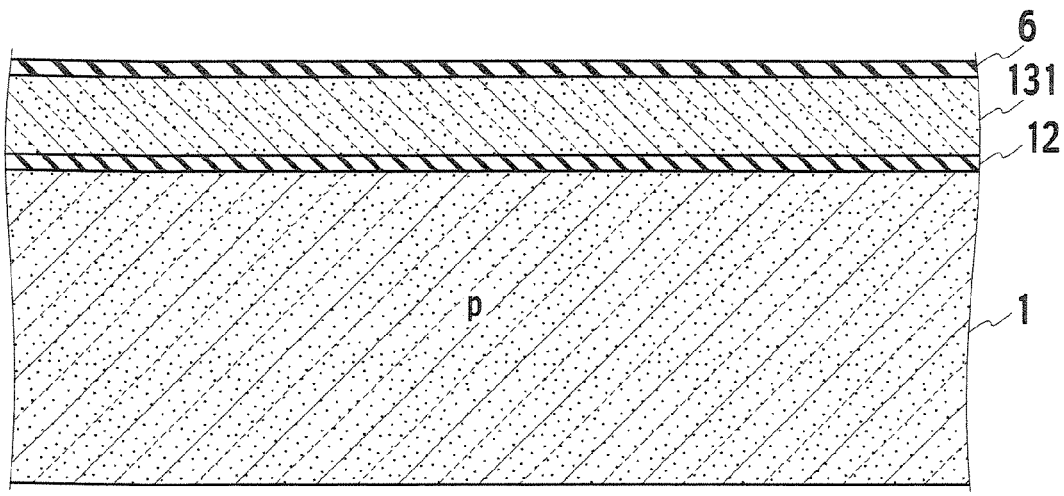
FIG. 33A is a cross-sectional view in the column direction after the process of FIG. 32A showing the method for manufacturing the non-volatile semiconductor memory.
Figure 33B:
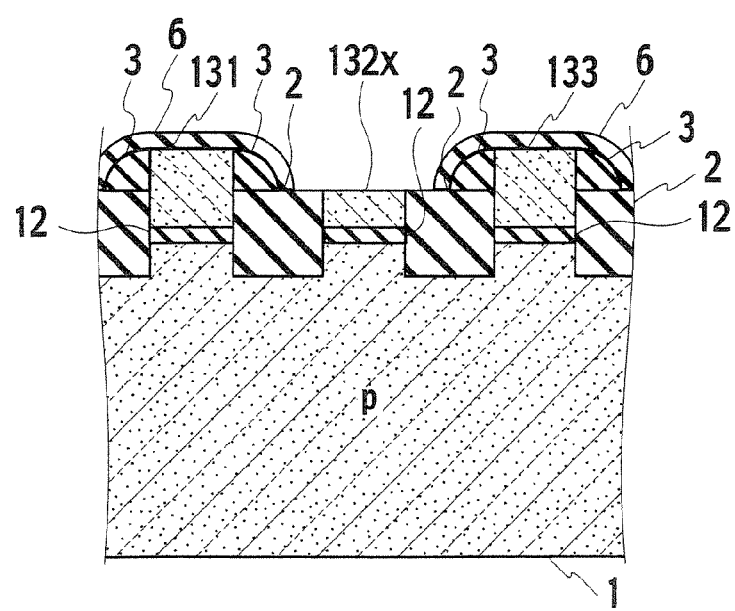
FIG. 33B is a cross-sectional view in the row direction after the process of FIG. 32B showing the method for manufacturing the non-volatile semiconductor memory.

As shown in FIGS. 32A and 32B, an insulating film (oxidation film) 6 is formed on the first floating gate layers 131 and 133 and the second floating gate layer (the lower member) 132x by thermal oxidation. A resist film is spin-coated on the third isolation insulating film 6, and an etching mask of the resist film is formed by a lithographic technique. Parts of the third isolation insulating film 6 are removed in a selective manner by reactive ion etching (RIE) in which an etching mask is used. After etching, the resist film is removed. As a result, as shown in FIGS. 33A and 33B, an opening portion is formed at the third isolation insulating film 6, and thereby the upper surface of the second floating gate layer (the lower member) 132x is exposed.

Figure 34A:
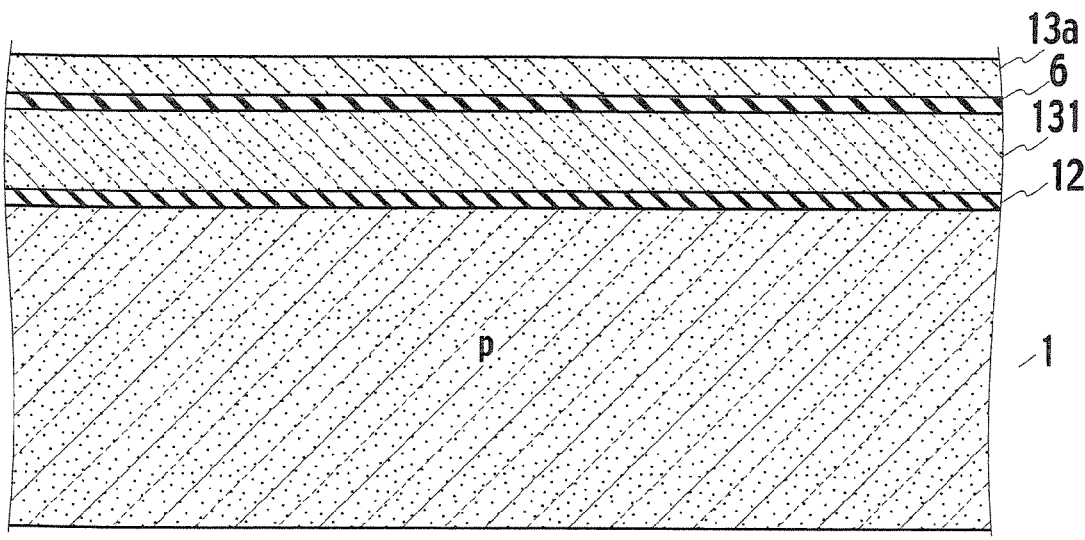
FIG. 34A is a cross-sectional view in the column direction after the process of FIG. 33A showing the method for manufacturing the non-volatile semiconductor memory.
Figure 34B:
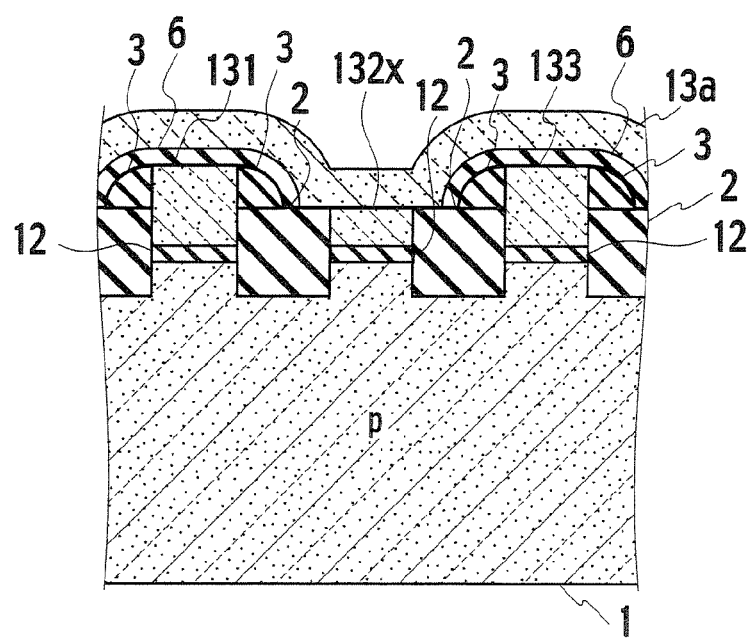
FIG. 34B is a cross-sectional view in the row direction after the process of FIG. 33B showing the method for manufacturing the non-volatile semiconductor memory.
Figure 35A:
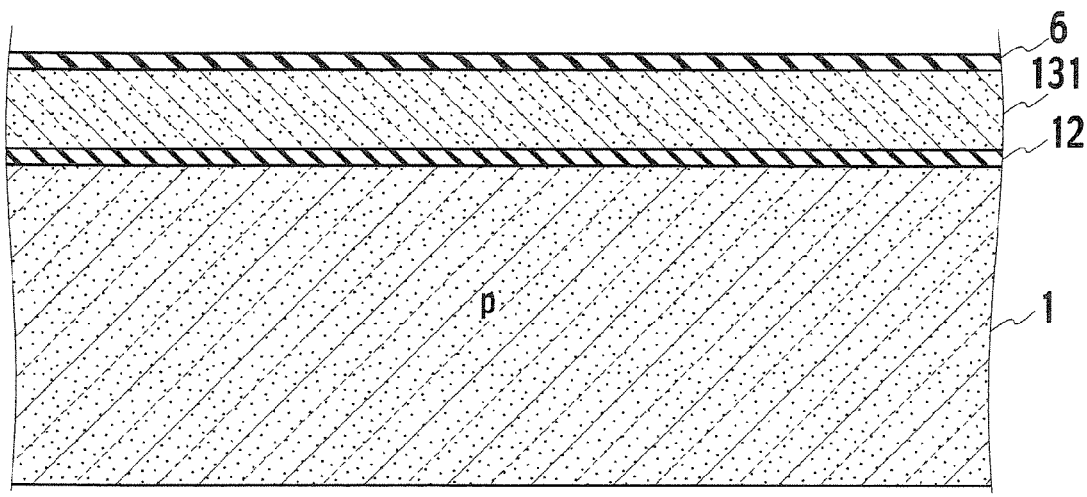
FIG. 35A is a cross-sectional view in the column direction after the process of FIG. 34A showing the method for manufacturing the non-volatile semiconductor memory.
Figure 35B:
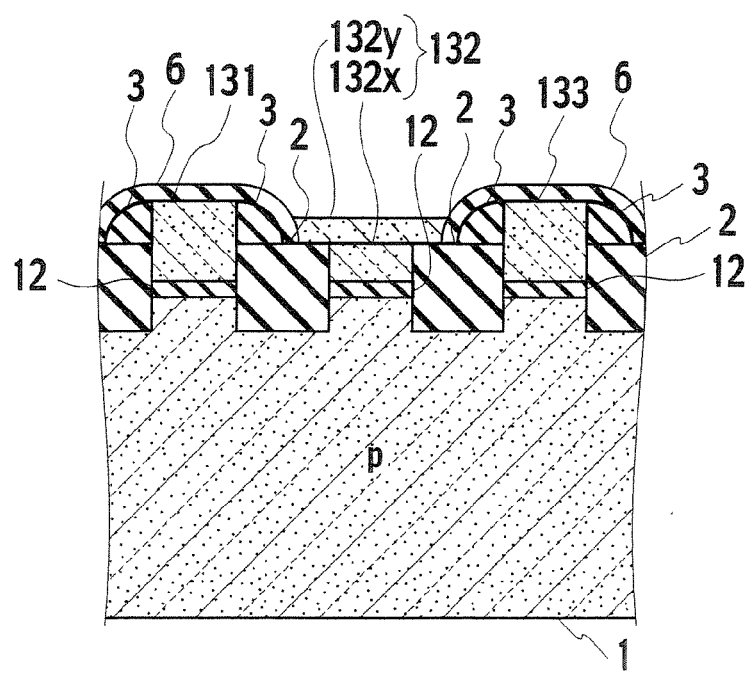
FIG. 35B is a cross-sectional view in the row direction after the process of FIG. 34B showing the method for manufacturing the non-volatile semiconductor memory.

Next, as shown in FIGS. 34A and 34B, another P-doped polysilicon layer (third conductive layer) 13a is deposited on the third isolation insulating film 6 and the second floating gate layer (the lower member) 132x by reduced pressurized CVD (RPCVD) or the like so that the thickness of the polysilicon layer 13a may be in a range of about ten nm to about 200 nm. As shown in FIGS. 35A and 35B, the polysilicon layer 13a is etched back by RIE or the like. As a result, an upper member 132y, which is apart of the polysilicon layer 13a, is formed. Thereby, the second floating gate layer 132, in which a horizontal level of an uppermost portion of the upper surface thereof is lower than the first floating gate layers 131 and 133, and the area of the upper surface thereof is larger than the area of the lower surface thereof, is formed. The second floating gate layer 132 includes the upper member 132y and the lower member 132x.

Figure 36A:
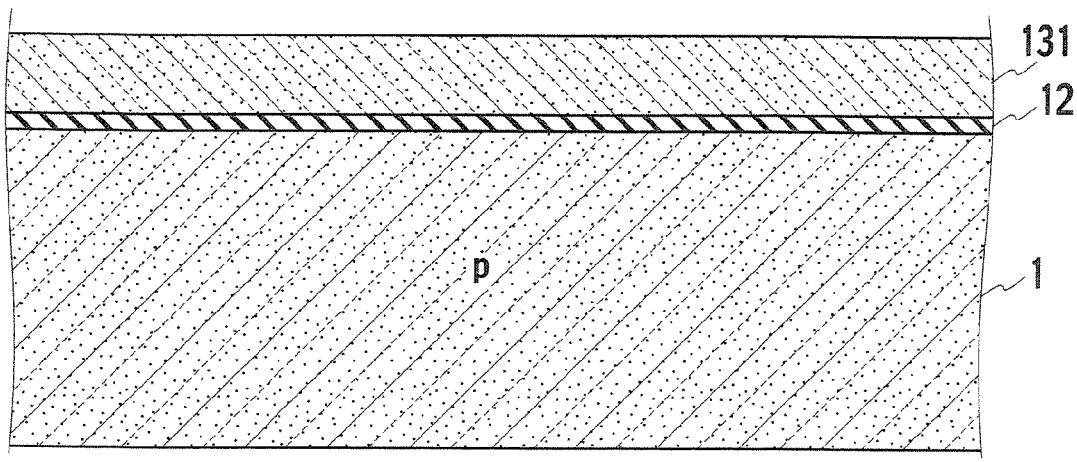
FIG. 36A is a cross-sectional view in the column direction after the process of FIG. 35A showing the method for manufacturing the non-volatile semiconductor memory.
Figure 36B:
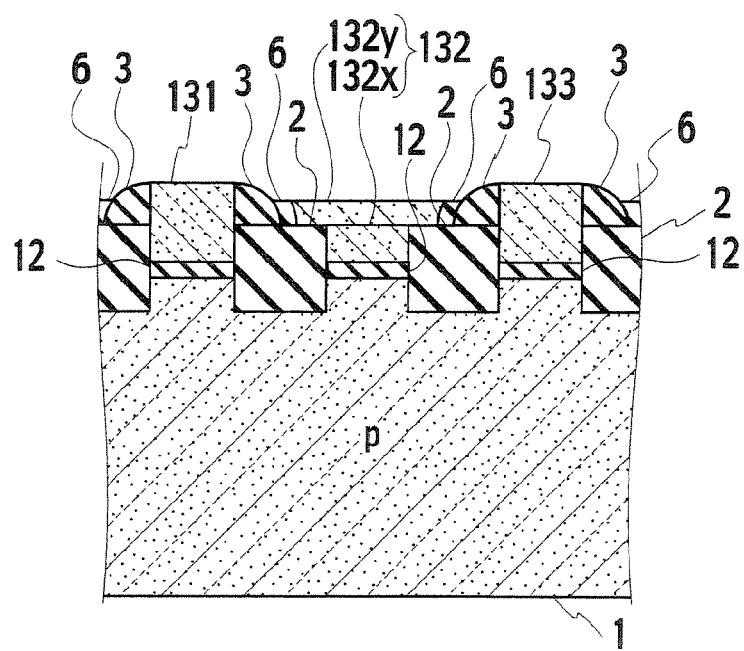
FIG. 36B is a cross-sectional view in the row direction after the process of FIG. 35B showing the method for manufacturing the non-volatile semiconductor memory.

A resist film is spin-coated on the third isolation insulating film 6 and the second floating gate layer 132, and an etching mask of the resist film is formed by a lithographic technique. Parts of the third isolation insulating film 6 are removed in a selective manner by reactive ion etching (RIE) in which an etching mask is used. Thereafter the resist film is removed. As a result, as shown in FIGS. 36A and 36B, an opening portion is formed at the third isolation insulating film 6, and the upper surfaces of the first floating gate layers 131 and 133 are exposed. Note that, when the third isolation insulating film 6, shown in FIGS. 35A and 35B and the second isolation insulating film 3 are of different materials from each other, for example, the third isolation insulating film 6 is a $SiO_2$ film and the second isolation insulating film 3 is a $Si_3N_4$ film, as shown in FIGS. 36A and 36B, a part of the third isolation insulating film 6 may be removed in a selective manner by selectivity etching, instead of forming an etching mask of a resist film.

Figure 37A:
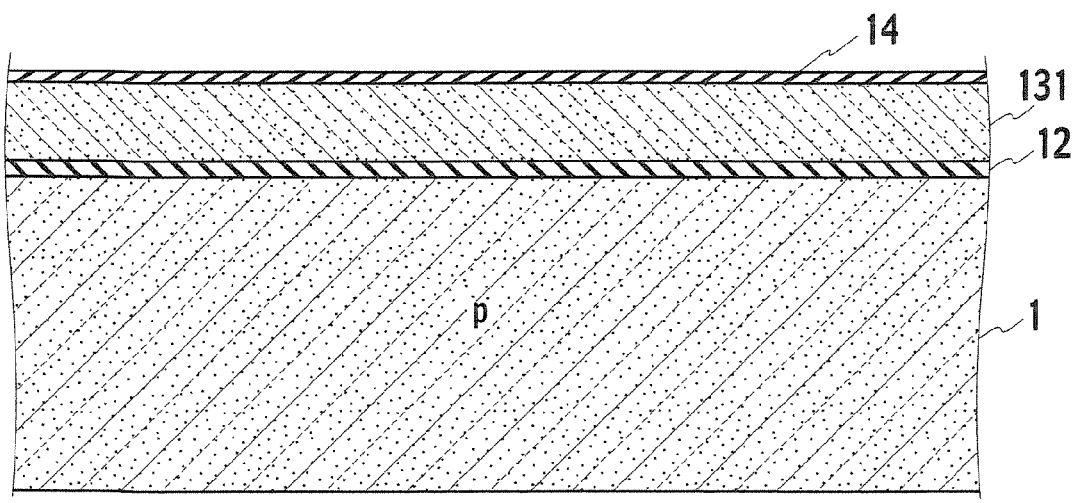
FIG. 37A is a cross-sectional view in the column direction after the process of FIG. 36A showing the method for manufacturing the non-volatile semiconductor memory.
Figure 37B:
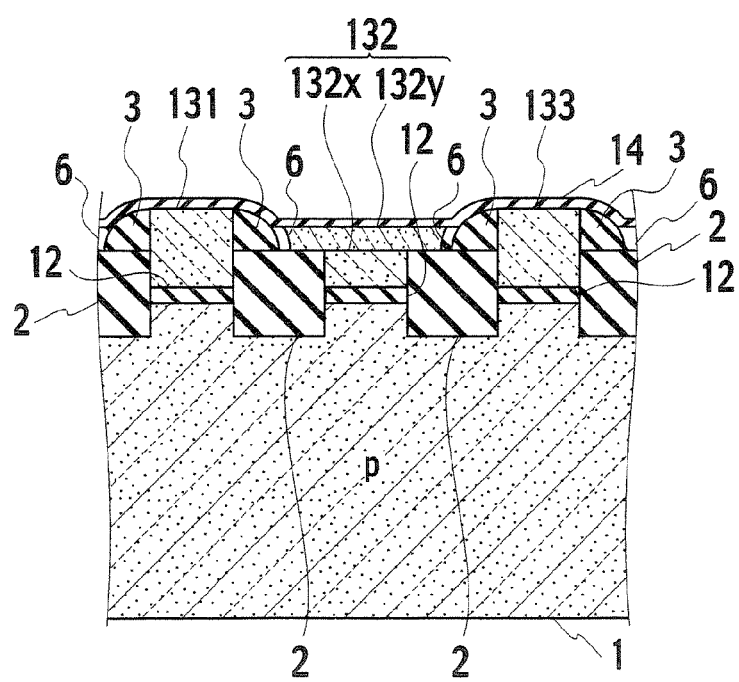
FIG. 37B is a cross-sectional view in the row direction after the process of FIG. 36B showing the method for manufacturing the non-volatile semiconductor memory.
Figure 38A:
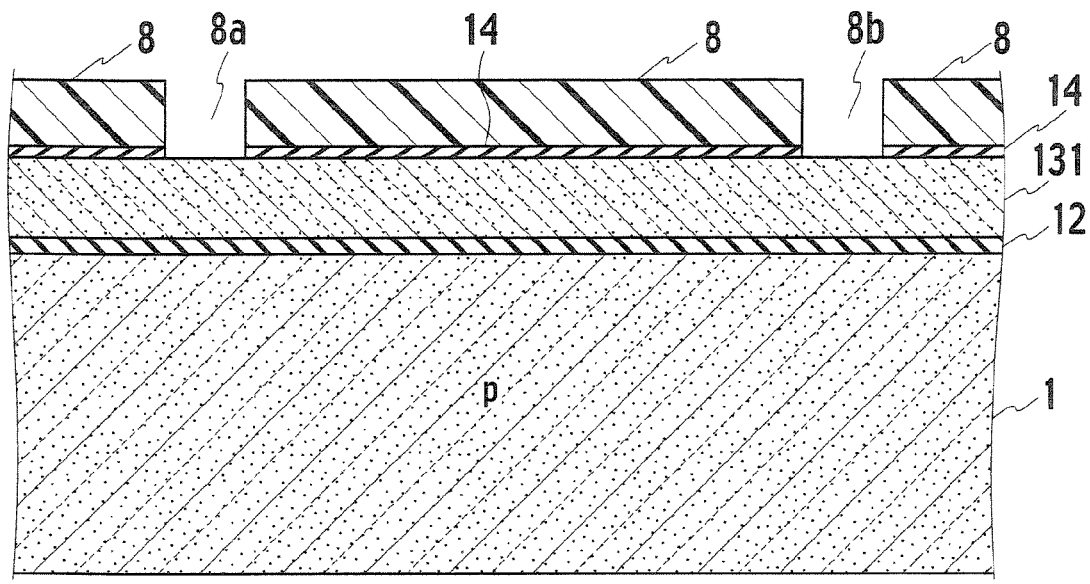
FIG. 38A is a cross-sectional view in the column direction after the process of FIG. 37A showing the method for manufacturing the non-volatile semiconductor memory.
Figure 38B:
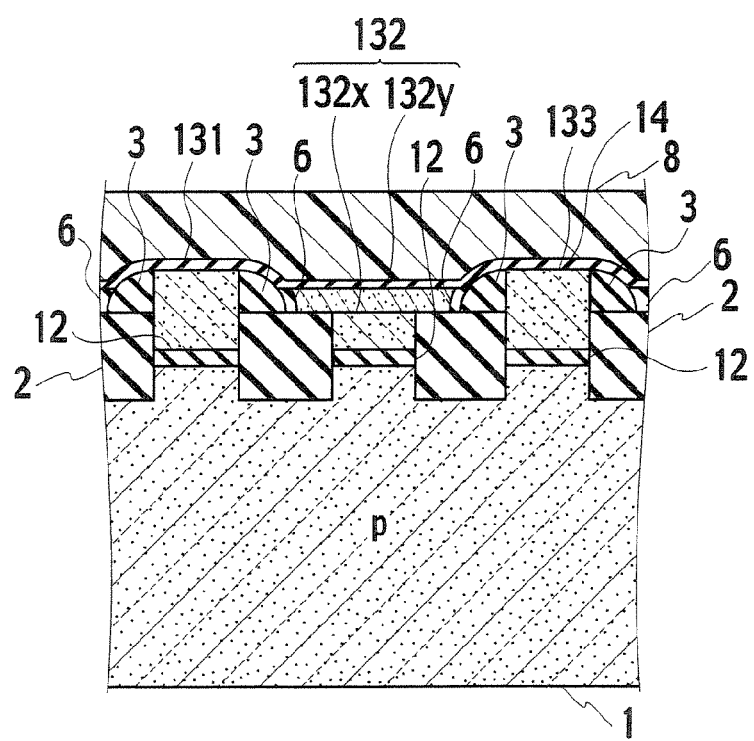
FIG. 38B is a cross-sectional view in the row direction after the process of FIG. 37B showing the method for manufacturing the non-volatile semiconductor memory.
Figure 39A:
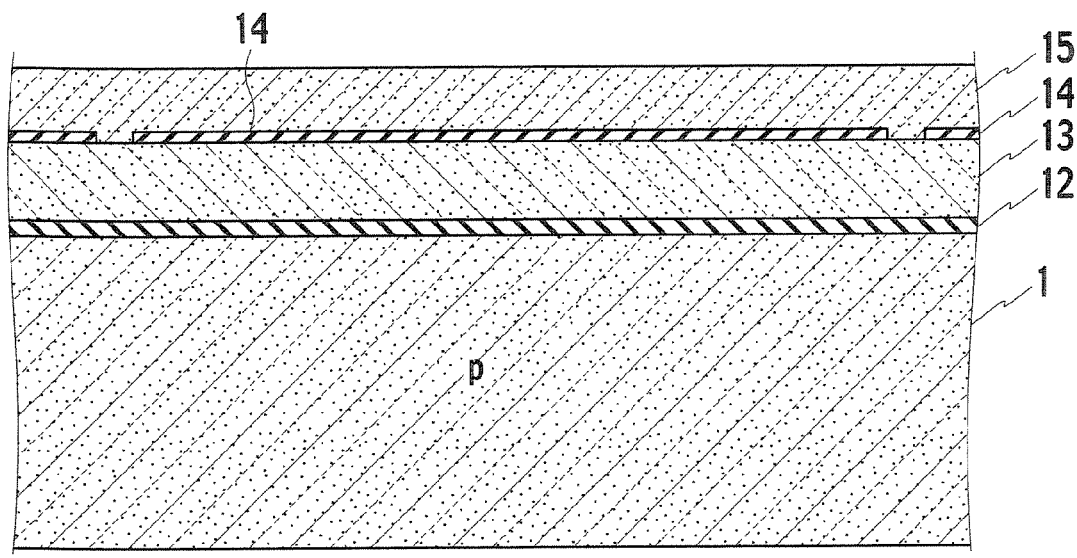
FIG. 39A is a cross-sectional view in the column direction after the process of FIG. 38A showing the method for manufacturing the non-volatile semiconductor memory.
Figure 39B:
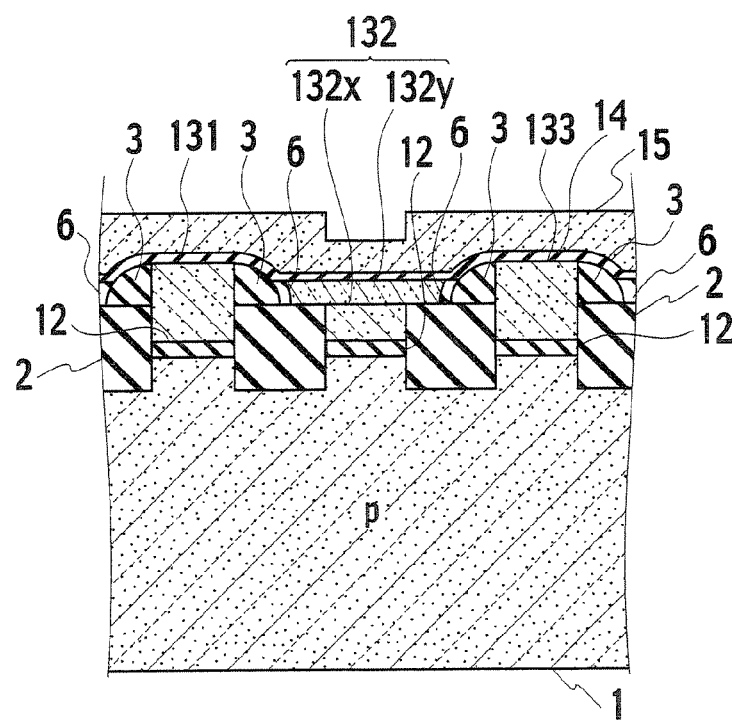
FIG. 39B is a cross-sectional view in the row direction after the process of FIG. 38B showing the method for manufacturing the non-volatile semiconductor memory.

As shown in FIGS. 37A and 37B, an inter-electrode insulating film 14 is deposited by CVD or the like on the tops of the first floating gate layers 131 and 133, the second floating gate layer 132 and the first isolation insulating film 2. A resist film 8 is coated on the inter-electrode insulating film 14, and the resist film 8 is patterned by lithography. As shown in FIGS. 38A and 38B, opening portions 8a and 8b are formed by RIE or the like in a part of the inter-electrode insulating film 14 with the patterned resist film 8 used as a mask. Then, the resist film 8 is removed. Thereafter, as shown in FIGS. 39A and 39B, a P-doped polysilicon layer (second conductive layer) 15, which will be a control gate electrodes, is deposited by CVD or the like on the inter-electrode insulating film 14 so that the thickness of the polysilicon layer 15 is approximately ten nm to approximately 200 nm.

Figure 40A:
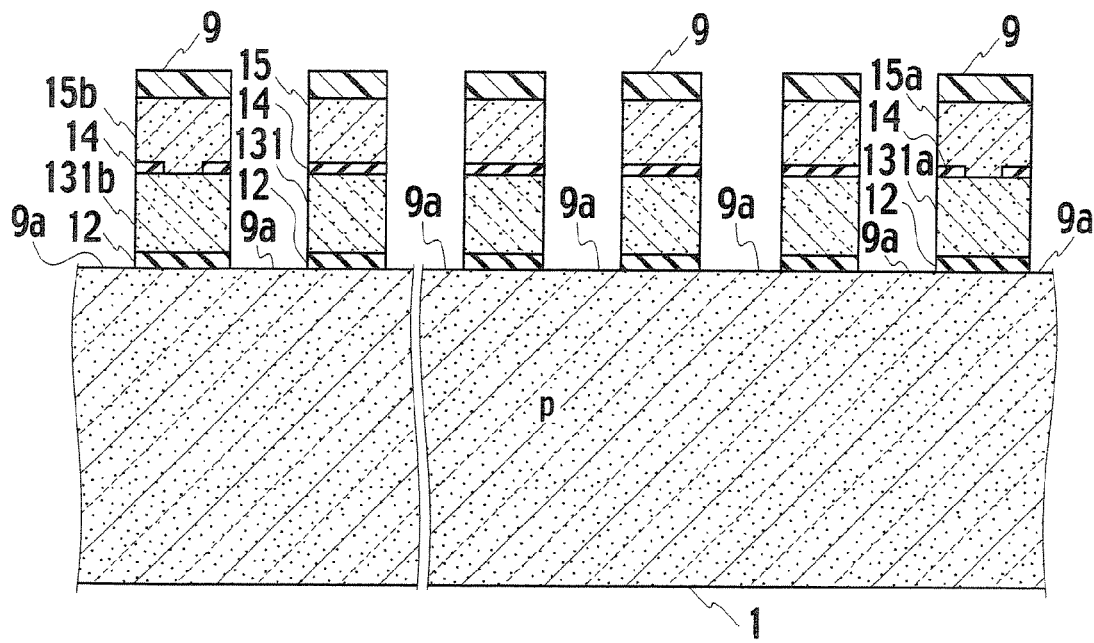
FIG. 40A is a cross-sectional view in the column direction after the process of FIG. 39A showing the method for manufacturing the non-volatile semiconductor memory.
Figure 40B:
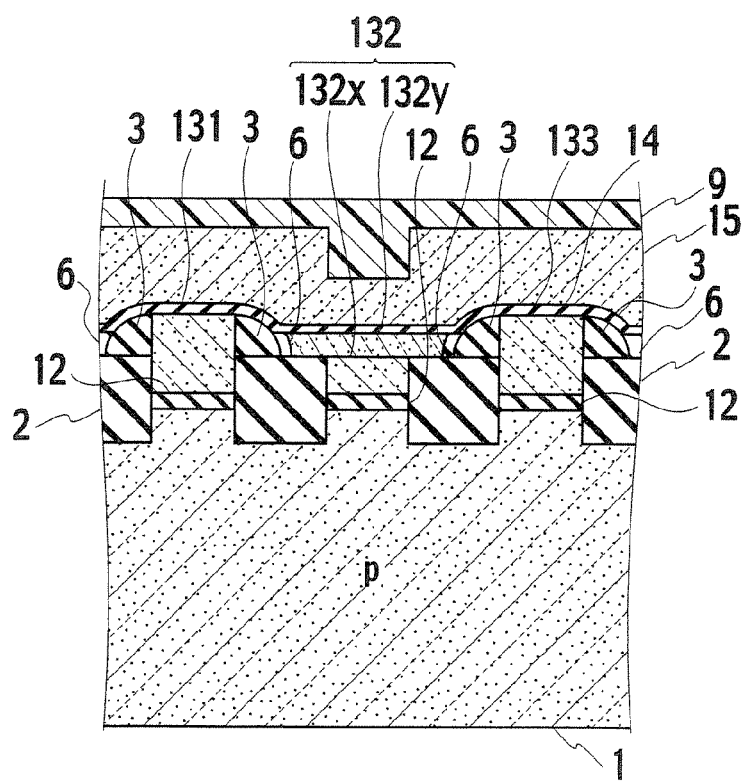
FIG. 40B is a cross-sectional view in the row direction after the process of FIG. 39B showing the method for manufacturing the non-volatile semiconductor memory.

Next, a resist film 9 is coated on the control gate electrode 15, and the resist film 9 is patterned by lithographic technique. As shown in FIGS. 40A and 40B, parts of the control gate electrode 15, the interelectrode insulating films 14, the first floating gate layer 131 and 133, the second floating gate layer 132 and the gate insulating film 12 are removed in the row direction, with the patterned resist film 9 used as a mask, by RIE in a selective manner until the substrate 1 is exposed. As a result, groove portions (second groove portions) 9a are formed in the row direction and penetrate the control gate electrodes 15, the interelectrode insulating film 14, the first floating gate layers 131 and 133, the second floating gate layer 132, and the gate insulating film 12. Patterns are formed having stacked structures of the control gate electrode 15, the first floating gate electrodes 131 and 133, and the second floating gate electrode 132. Simultaneously, the select gate electrodes 131 band 15b are formed. The resist film 9 is removed by a resist remover and the like.

Figure 41A:
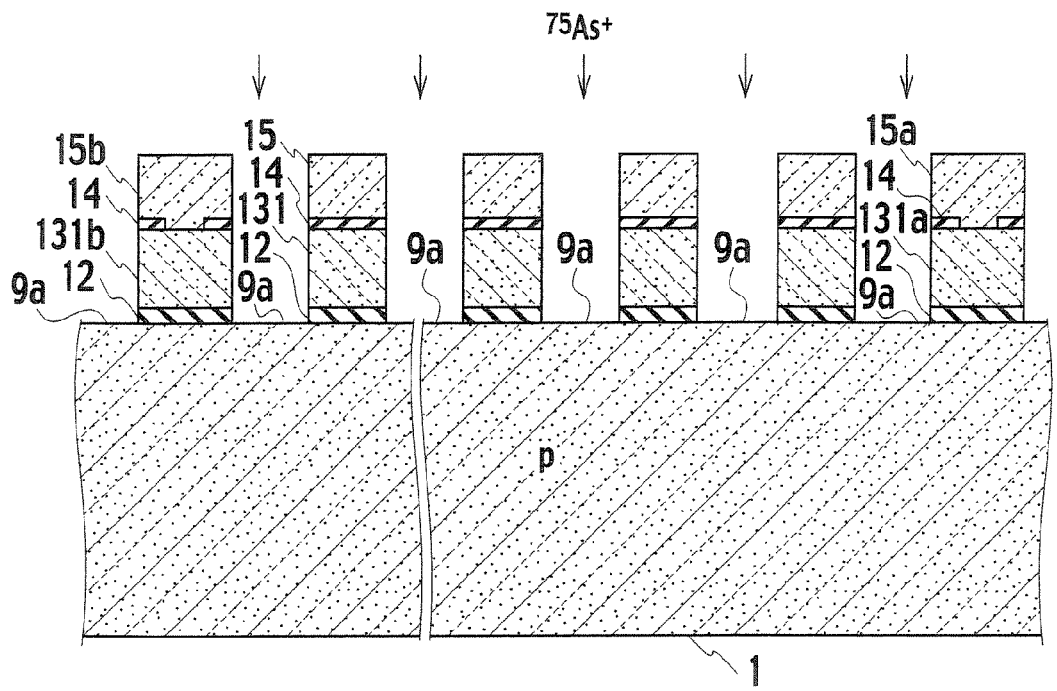
FIG. 41A is a cross-sectional view in the column direction after the process of FIG. 40A showing the method for manufacturing the non-volatile semiconductor memory.
Figure 41B:
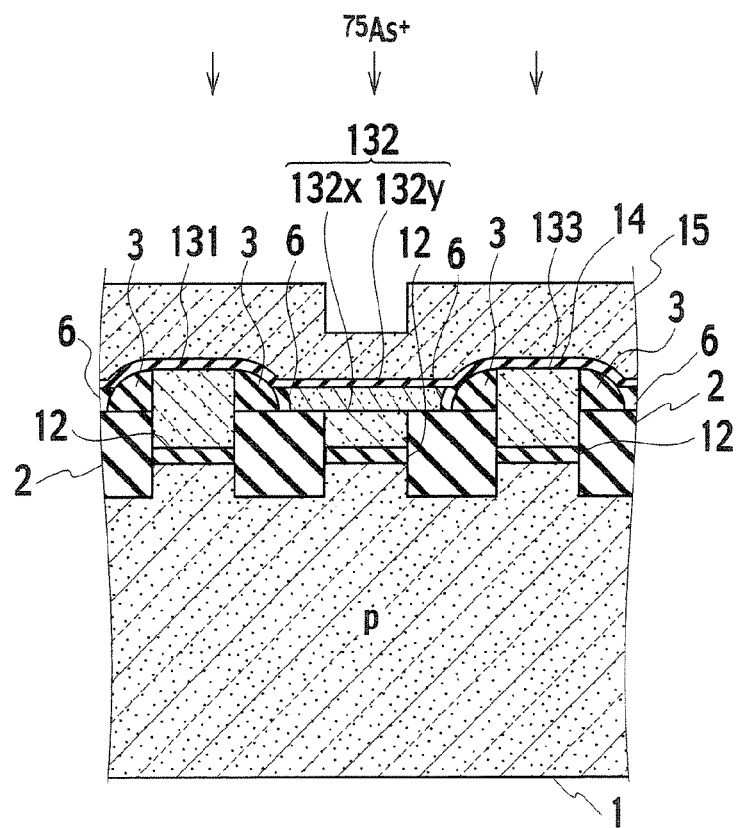
FIG. 41B is a cross-sectional view in the row direction after the process of FIG. 40B showing the method for manufacturing the non-volatile semiconductor memory.
Figure 42A:
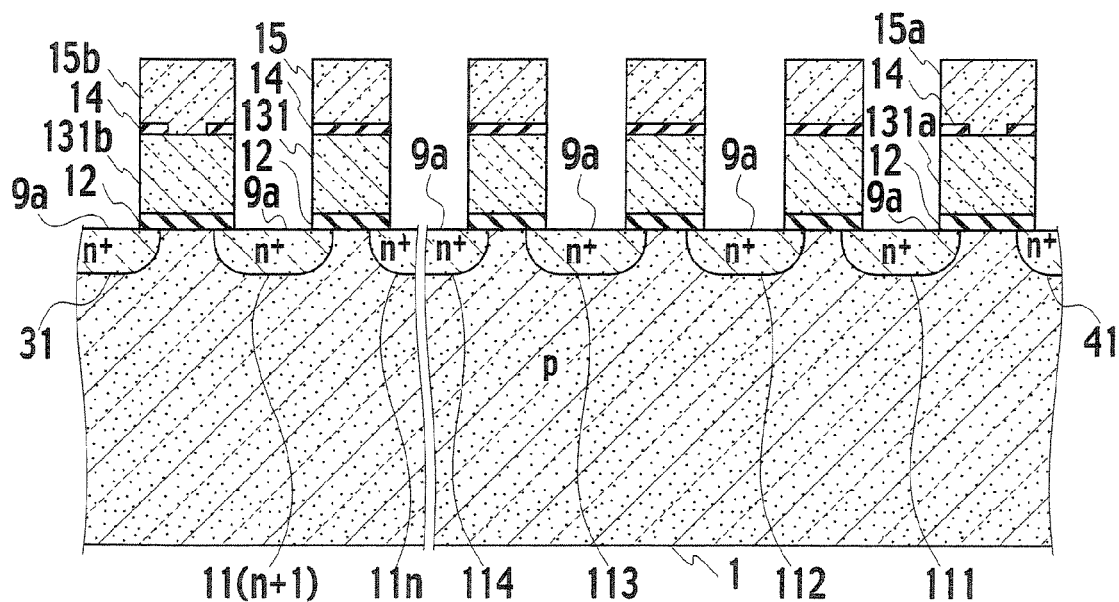
FIG. 42A is a cross-sectional view in the column direction after the process of FIG. 41A showing the method for manufacturing the non-volatile semiconductor memory.
Figure 42B:
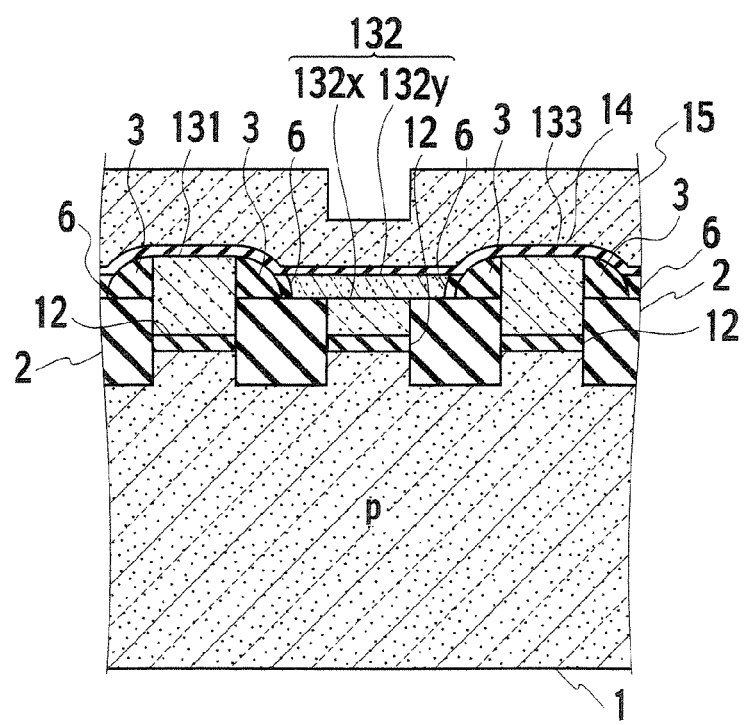
FIG. 42B is a cross-sectional view in the row direction after the process of FIG. 41B showing the method for manufacturing the non-volatile semiconductor memory.

Next, as shown in FIGS. 41A and 41B, by using the control gate electrode 15 as a mask, n-type impurity ions such as phosphorus ($^{31}P^+$), arsenic ($^{75}As^+$) or the like are implanted through the gate insulating film 12 into a $n^+$-type impurity diffusion layer 41 in a self-aligned manner. Thereafter, the n-type impurity ions in the first floating gate electrodes 131 and 133, the second floating gate electrode 132 and the control gate electrode 15 are activated by thermal processing. The n-type impurity ions in the substrate 1 are also activated by thermal processing. As shown in FIGS. 42A and 42B, Accordingly, as shown in FIGS. 41A and 41B, $n^+$-type source and drain regions 111 to 11($n$+1) are formed in the substrate 1, located under grooves 9$a$, and $n^-$-type channel regions are formed in the substrate 1 directly under the floating gate electrode 13. In this manner, memory cell transistors $MT_{11}$ to $MT_{1n}$ of a depletion mode transistor are formed. In this manner, a plurality of memory cell transistors, for which illustration is omitted, are formed in a matrix in which the memory cell transistors cross each other in the column and row directions.

Simultaneously, the select gate electrodes 131$a$ and 15$a$ are formed. An $n^+$-type impurity diffusion layer (source region) 41 is formed in substrate 1. Thereby, a select gate transistor $STS_1$ is formed. On the other hand, the $n^+$-type impurity diffusion layer (drain region) 31 is formed in the substrate 1. Thereby, the select gate transistor $STD_1$ is also formed.

Thereafter, a metal film is buried by CVD or the like in each of the openings to form the source line contact plug 181 and the bit line contact plug 171 so that the source line contact plug 181 and the bit line contact plug 171 are respectively connected to the source region 41 and the drain region 31. Subsequently, predetermined interconnects and insulating films are deposited and formed thereon. Accordingly, the non-volatile semiconductor memory shown in FIGS. 1 to 4 is fabricated.

In accordance with the method for manufacturing the non-volatile semiconductor memory according to the embodiment of the present invention, as shown in FIGS. 24A to 42B, the non-volatile semiconductor memory according to the embodiment of the present invention can be provided.

Furthermore, in the method for manufacturing the non-volatile semiconductor memory according to the second comparative example shown in FIG. 22, it is difficult to deposit the interelectrode insulating films 14 between the floating gate electrodes 151, 152 and 153 with a length of at least approximately ten to approximately fifteen nm, and bury the control gate electrode 15, due to increased integration.

By contrast, in accordance with the method for manufacturing the non-volatile semiconductor memory according to the embodiment of the present invention, the horizontal level of the second floating gate layer 132 is decreased so as to be lower than the horizontal level of the first floating gate layers 131 and 133, and the upper surface of the second floating gate layer 132 opposite to the control gate electrode 15. Therefore, the interelectrode insulating films 14 and the control gate electrode 15 may not provided between the first floating gate electrodes 131 and 133 and the second floating gate electrode 132. Therefore, it is possible to easily provide structures in which the capacitances $C_{11}$, $C_{12}$ and $C_{13}$ between each of the first floating gate electrodes 131 and 133, and the second floating gate electrode 132 and each of the control gate electrodes 15, are larger than the capacitance $C_{21}$, $C_{22}$ and $C_{23}$ between each of the first floating gate electrodes 131 and 133 and the second floating gate electrode 132, and each of the channel region.

First Modification

In the embodiment of the present invention, the description has been made of the case where the floating gate electrode 132 shown in FIG. 1 has a T-shaped (convex) cross-sectional shape; however, the shape of the second floating gate 132 is not particularly limited. In a first comparison, a description will be made of an example of another shape of the second floating gate electrode 132.

Figure 43:
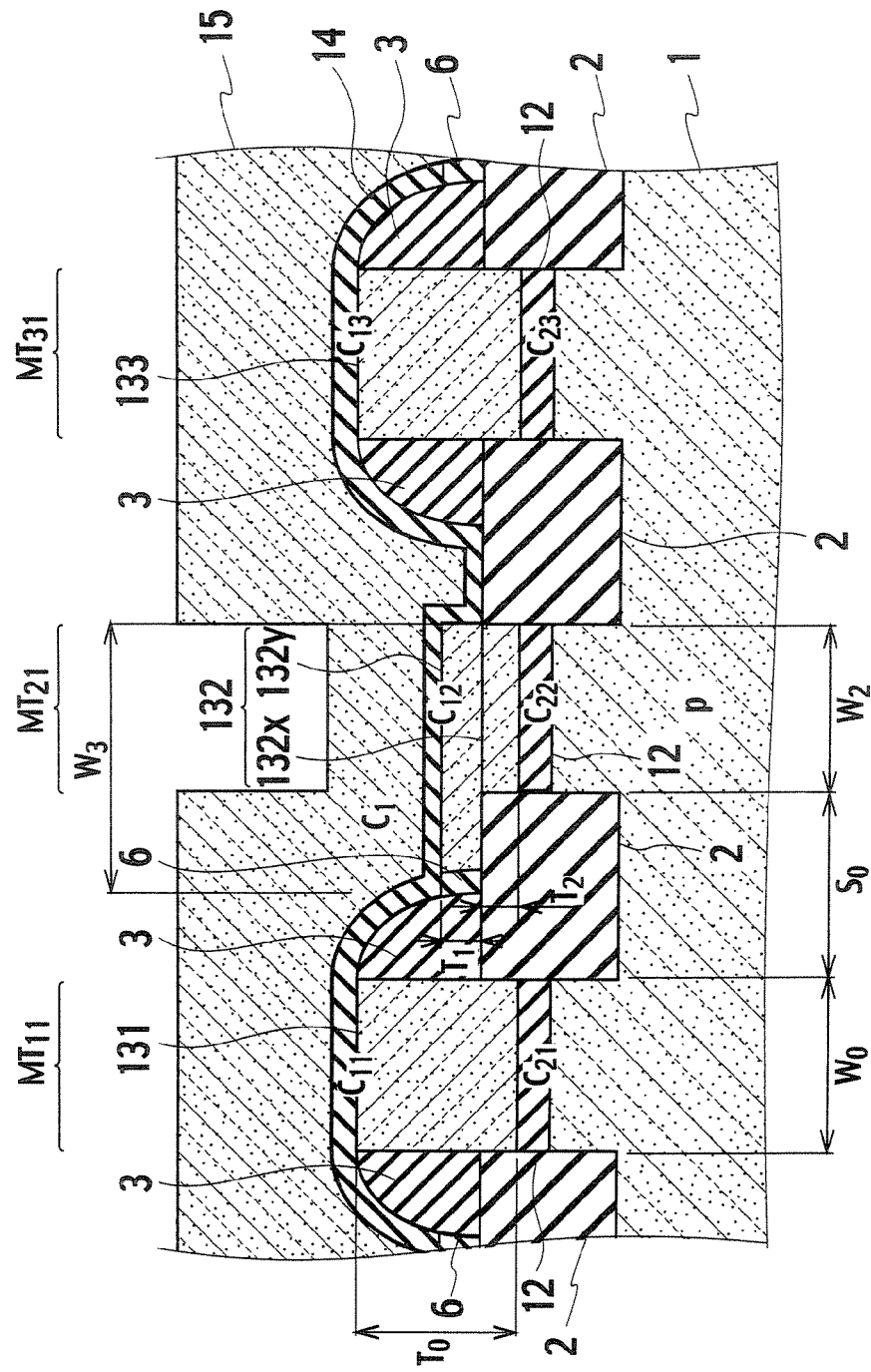
FIG. 43 is a cross-sectional view in the row direction showing an example of a cell array of a non-volatile semiconductor memory according to a first modification of the embodiment of the present invention.

For example, as shown in FIG. 43, the cross-sectional shape of the second floating gate electrode 132 in the row direction may be a hook shape (L-shape). The second floating gate electrode 132 includes the lower member 132$x$ having the width $W_2$, and the upper member 132$y$ having a width $W_3$, which is wider than the width $W_2$ and disposed on the lower member 132$x$. With regard to a method of forming the second floating gate electrode 132 shown in FIG. 43, for example, it is satisfactory if the mask film is formed on a part of the upper surface of the upper member 132$y$ shown in FIGS. 36A and 36B, and then a part of the upper member is selectively removed by RIE using the mask film as a mask, and the like.

Figure 44:
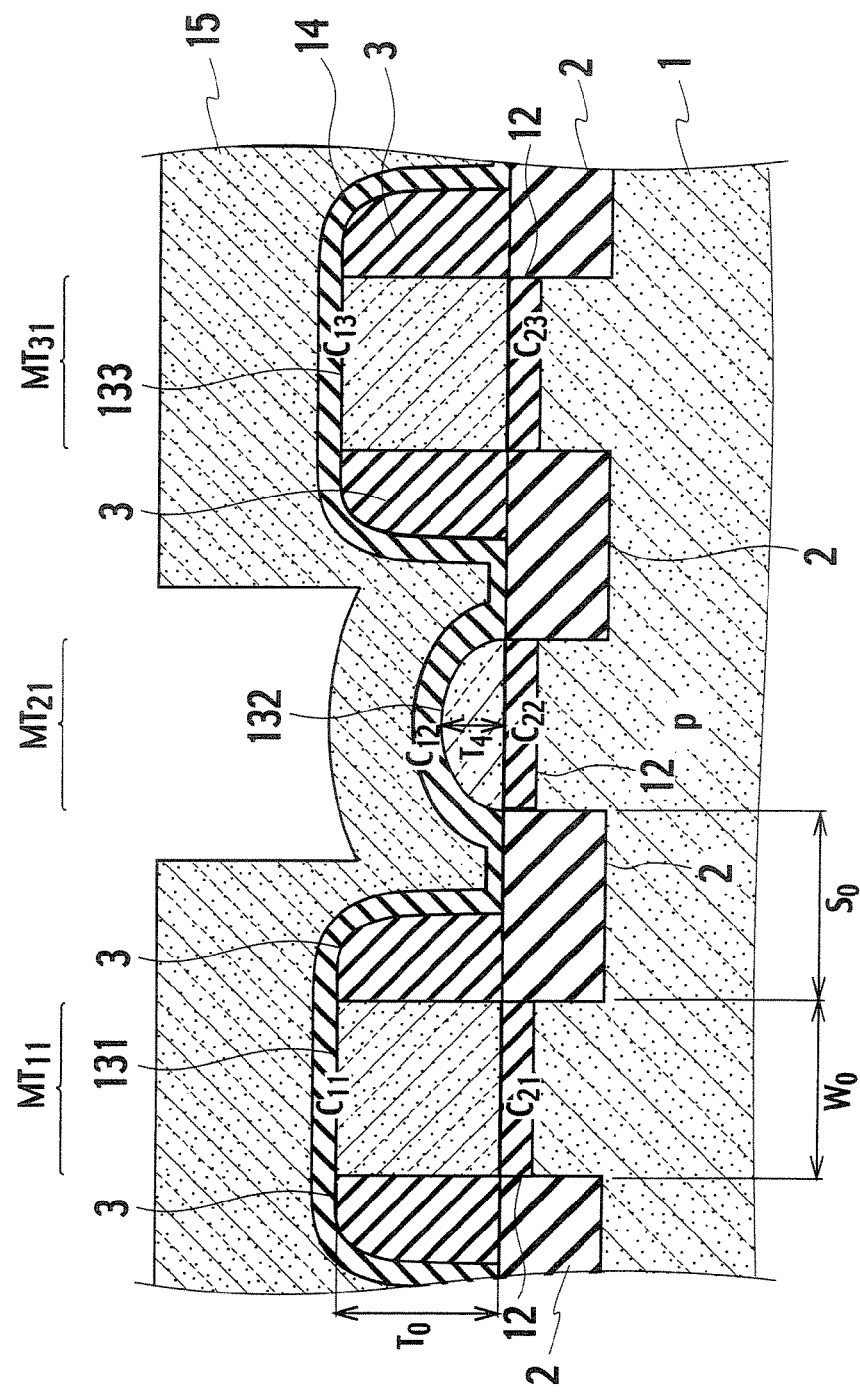
FIG. 44 is a cross-sectional view in the row direction showing another example of the cell array of the non-volatile semiconductor memory according to the first modification.

Moreover, as shown in FIG. 44, the upper surface of the second floating gate electrode 132 may also be a curved surface. A thickness $T_4$ from the uppermost portion of the second floating gate electrode 132 to the lower surface thereof is thinner than the thickness $T_0$ of the first floating gate electrodes 131 and 133, and the horizontal level of the uppermost portion is lower than that of the first floating gate electrodes 131 and 133. Since the upper surface of the second floating gate electrode 132 is a curved surface, the upper surface has a larger area than the lower surface. With regard to a method of forming the second floating gate electrode 132 shown in FIG. 44, for example, it is satisfactory if the element isolation insulating film 2 shown in FIGS. 28A and 28B is etched to the upper surface level of the gate insulating film 12, the mask film is formed on the first floating gate electrodes 131 and 133, and a part of the second floating gate electrode 132 is selectively removed by RIE, isotropic etching, and the like.

Figure 45:
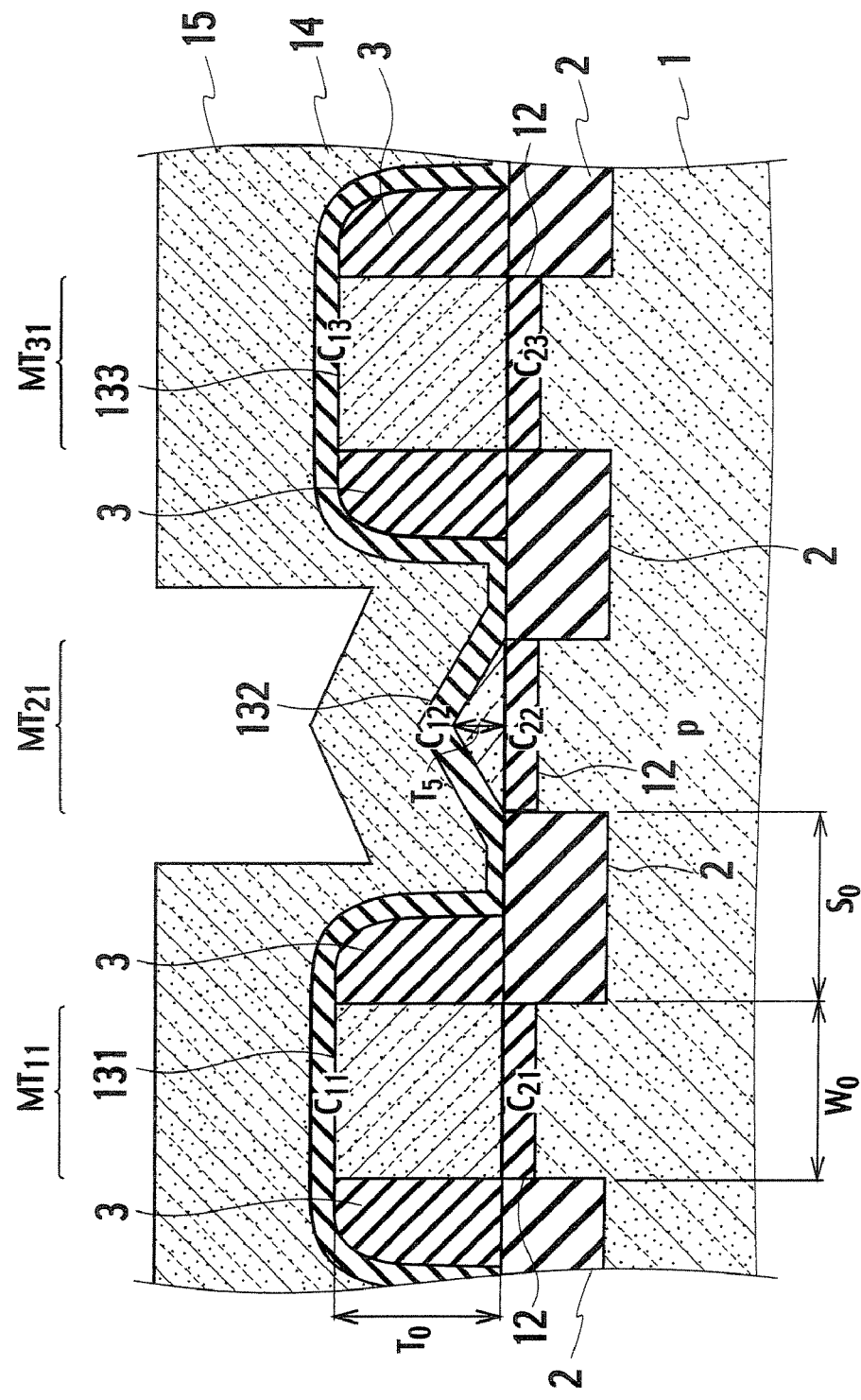
FIG. 45 is a cross-sectional view in the row direction showing further example of the cell array of the non-volatile semiconductor memory according to the first modification.

Moreover, the upper surface of the second floating gate electrode 132 may include a plurality of surfaces. For example, as shown in FIG. 45, the cross-sectional shape of the second floating gate electrode 132 in the row direction is triangular. A thickness $T_5$ from the uppermost portion of the second floating gate electrode 132 to the lower surface thereof is thinner than the thickness $T_0$ of the first floating gate electrodes 131 and 133, and the horizontal level of the uppermost portion is lower than that of the first floating gate electrodes 131 and 133. Since the upper surface of the second floating gate electrode 132 has a plurality of surfaces, the upper surface has a larger area than the lower surface. With regard to a method of forming the second floating gate electrode 132 shown in FIG. 45, for example, it is satisfactory if the element isolation insulating film 2 shown in FIGS. 28A and 28B is etched to the upper surface level of the gate insulating film 12. A mask film is formed on the first floating gate electrodes 131 and 133, and a part of the second floating gate electrode 132 is selectively removed by RIE, and the like.

Even in the case where the shape of the floating gate electrode 132 is as shown in FIGS. 43 to 45, the area of the upper surface is larger than that of the lower surface, and accordingly, the capacitance $C_{12}$ of the inter-electrode insulating film can be increased so as to be larger than the capacitance $C_{22}$ of the gate insulating film. Moreover, though not shown, the cross-sectional shapes of the second floating gate electrode 132 in the row direction and the column direction may be a T-shape (convex).

Figure 46:
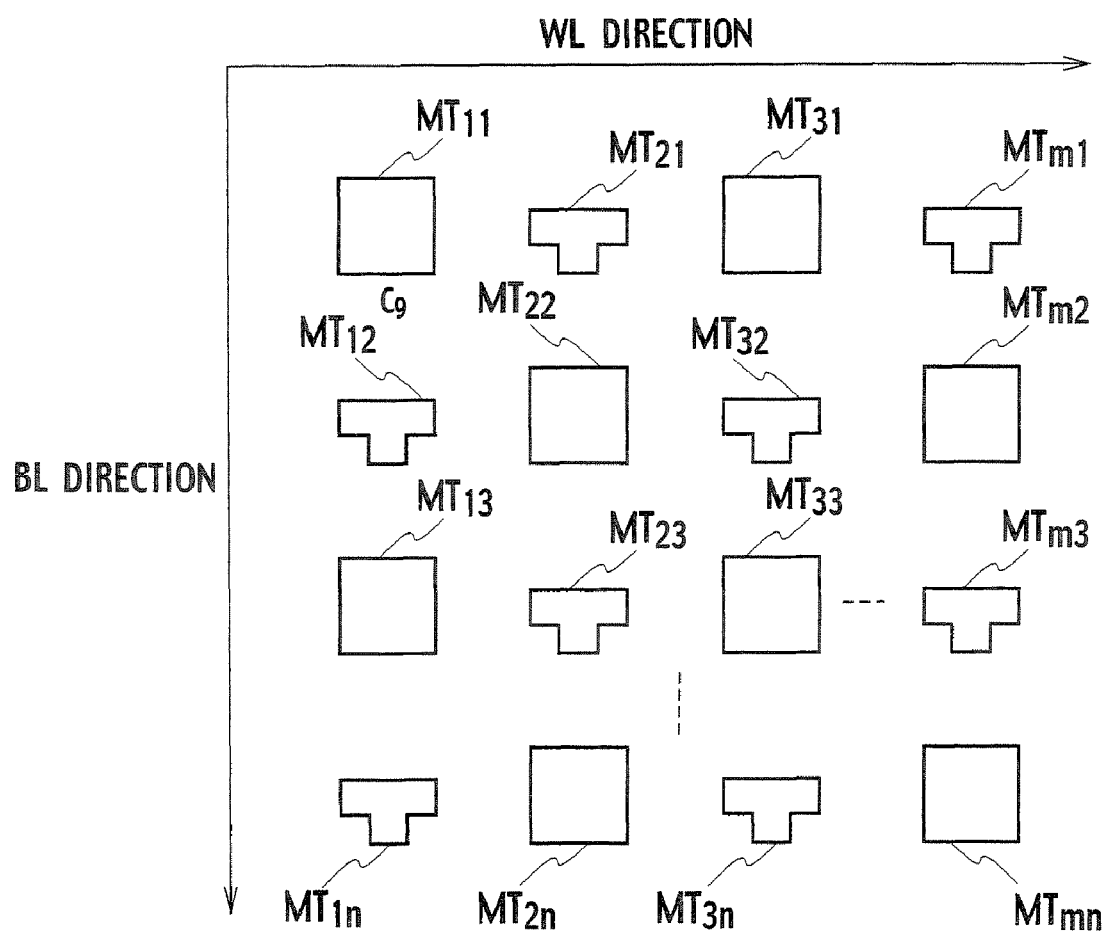
FIG. 46 is a schematic view for explaining an arrangement of floating gate electrodes of the non-volatile semiconductor memory according to the first modification.
Figure 47:
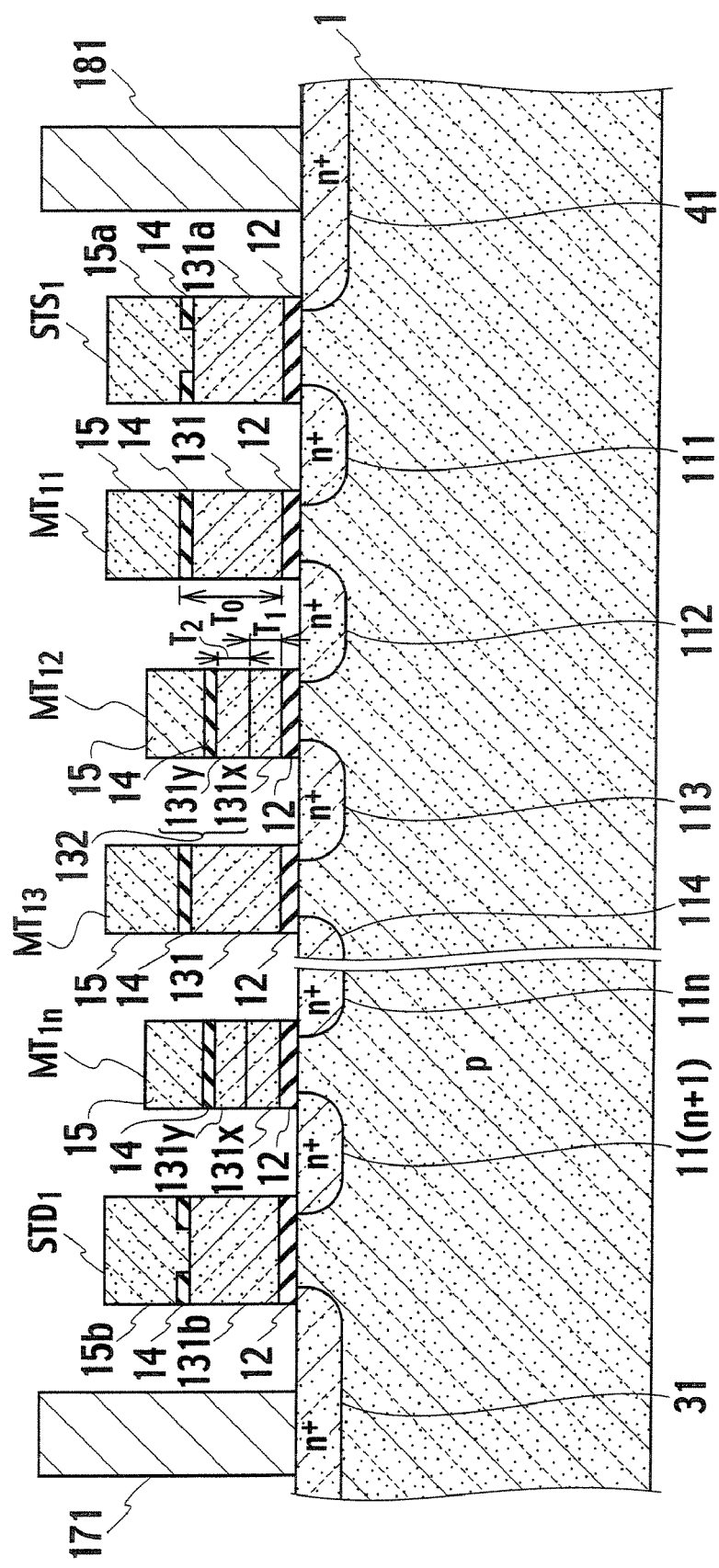
FIG. 47 is a cross-sectional view in the column direction showing an example of the cell array of the non-volatile semiconductor memory according to the first modification.

Moreover, in the embodiment of the present invention, the description has been made of the example where the first floating gate electrodes 131 and 133 and the second floating gate electrodes 132 are arranged in the row direction alternately and cyclically as shown in FIG. 5; however, the arrangement positions of the first floating gate electrodes 131 and 133 and the second floating gate electrodes 132 are not particularly limited. For example, as shown in FIG. 46, the first floating gate electrodes 131 and 133 and the second floating gate electrodes 132 are also arranged in the column direction alternately and cyclically, and may thus be arranged in a checkered pattern. In this case, as shown in FIG. 47, even when viewed in the column direction, the first floating gate electrodes 131 and 133 and the second floating gate electrodes 132 are arranged alternately. The opposite areas of the second floating gate electrodes 132 to the adjacent gates are smaller than that of the first floating gate electrodes 131 and 133. Accordingly, a capacitance $C_9$ between the adjacent gates can be more reduced in the column direction than in the case were the memory cell array is composed only of the first floating gate electrodes 131 and 133.

As described above, according to the first modification, if the horizontal level of the uppermost portion of the second floating gate electrode is lower than that of the first floating gate electrodes, and the area of the upper surface of the second floating gate electrode is larger than the area of the lower surface. Thus, it is possible to employ various shapes for the second floating gate electrode. Moreover, if a structure is adopted in which at least the first and second floating gate electrodes are adjacent to each other, then various structural arrangements are possible for the positions of the first and second floating gate electrodes.

Second Modification

An example of a method for manufacturing a non-volatile semiconductor memory according to a second modification of the embodiment of the present invention will be described, referring to FIGS. 48 to 54. FIGS. 48 to 54 are cross-sectional views in the row direction, taken along the A-A line of FIG. 1.

Figure 48:
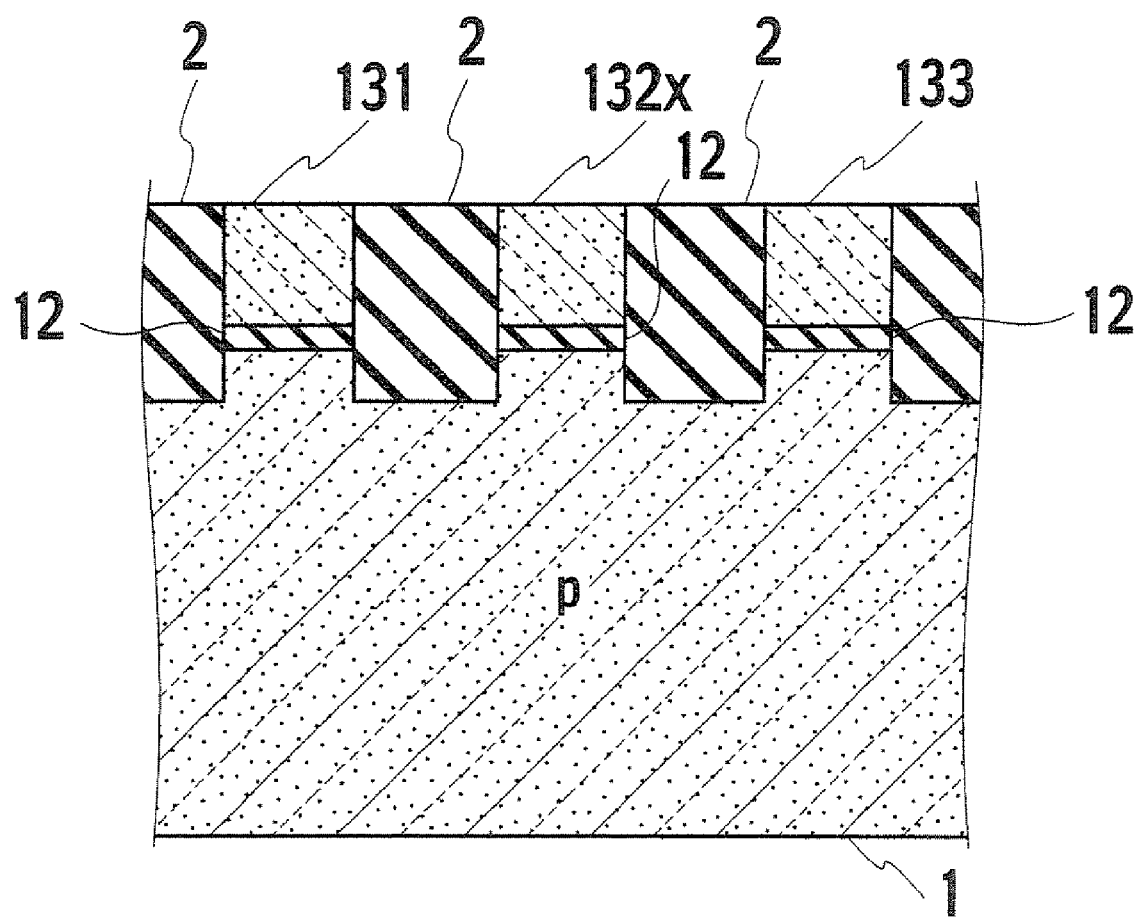
FIG. 48 is a cross-sectional view in the row direction showing a method for manufacturing a non-volatile semiconductor memory according to a second modification of the present invention.
Figure 49:
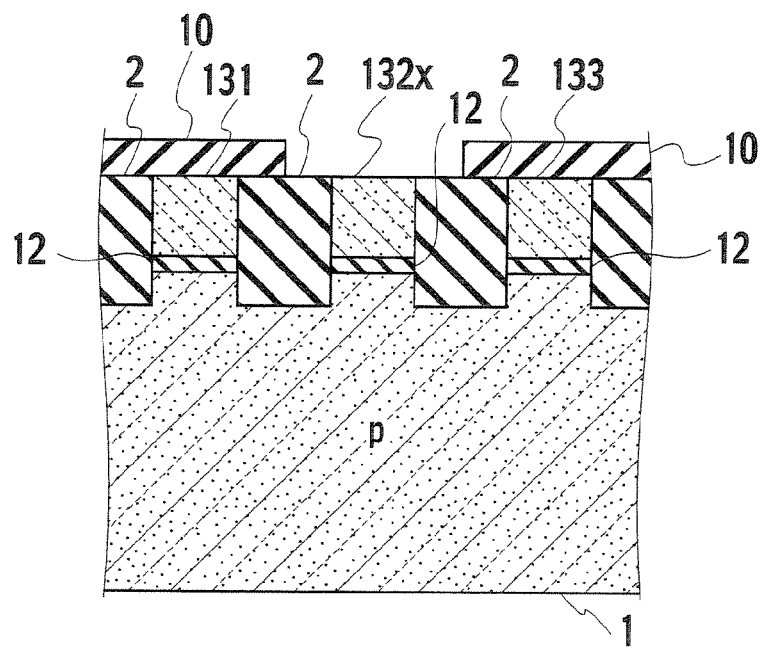
FIG. 49 is a cross-sectional view in the row direction after the process of FIG. 48.
Figure 50:
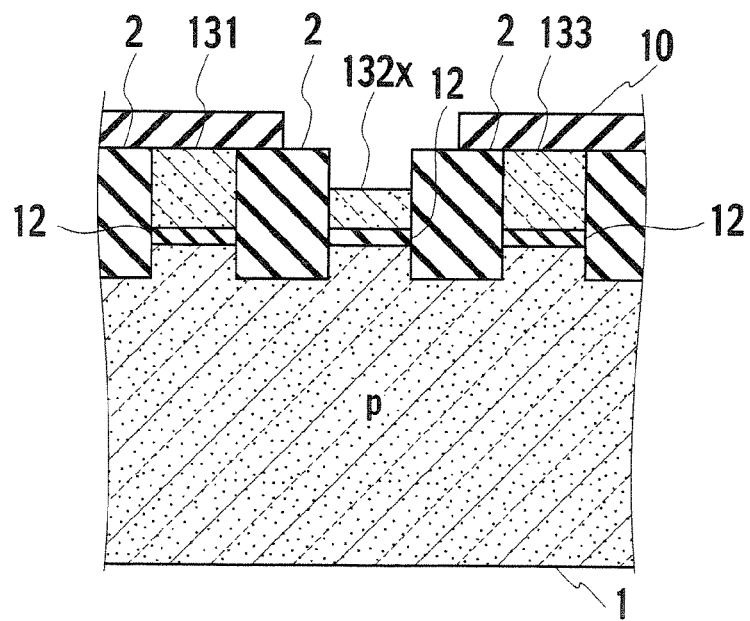
FIG. 50 is a cross-sectional view in the row direction after the process of FIG. 49.

After the element isolation insulating film 2 is deposited as shown in FIG. 27B, the element isolation insulating film 2 is etched back by chemical mechanical polishing (CMP), and the mask film 4 is also removed. As a result, as shown in FIG. 48, the upper surfaces of the first floating gate layers 131 and 133 and the second floating gate layer 132x and the upper surface of the element isolation insulating film 2 are horizontally aligned with each other. The mask film 10 is deposited by CVD and the like on the upper surfaces of the first floating gate layers 131 and 133, the second floating gate layer 132x, and the element isolation insulating film 2. A resist film is spin-coated on the mask film 10, and an etching mask of the resist film is formed by using photolithography technology. A part of the mask film 10 is selectively removed by RIE using the etching mask, and the like. As a result, as shown in FIG. 49, the mask film 10 is patterned. By using the patterned mask film 10 as a mask, a part of the second floating gate layer 132x is selectively removed in the depth direction. As a result, the lower member 132x as shown in FIG. 50 is formed.

Figure 51:
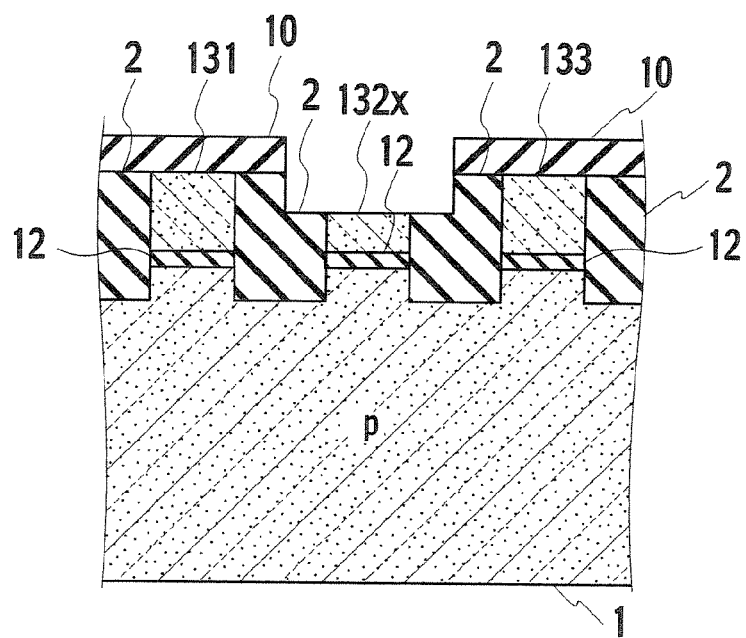
FIG. 51 is a cross-sectional view in the row direction after the process of FIG. 50.
Figure 52:
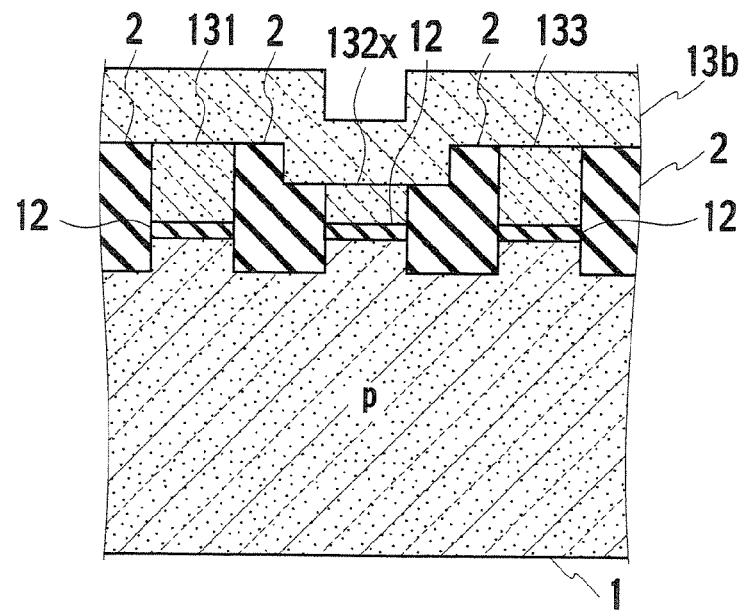
FIG. 52 is a cross-sectional view in the row direction after the process of FIG. 51.
Figure 53:
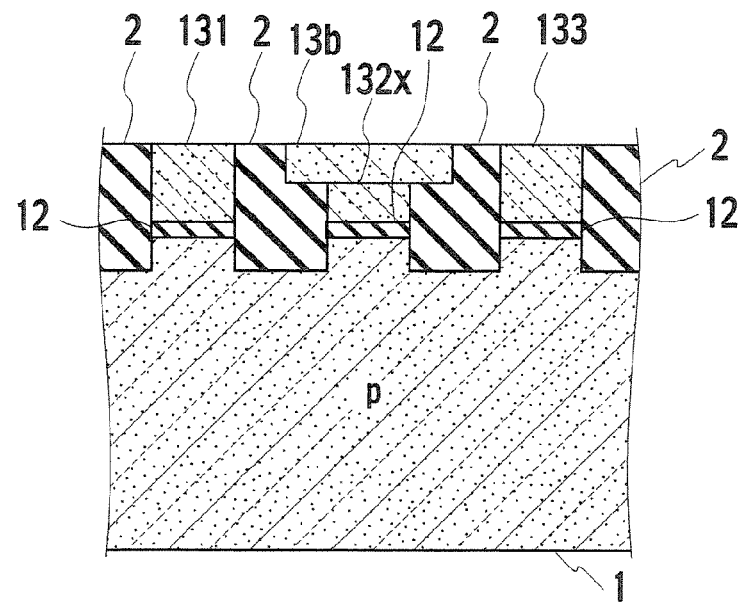
FIG. 53 is a cross-sectional view in the row direction after the process of FIG. 52.
Figure 54:
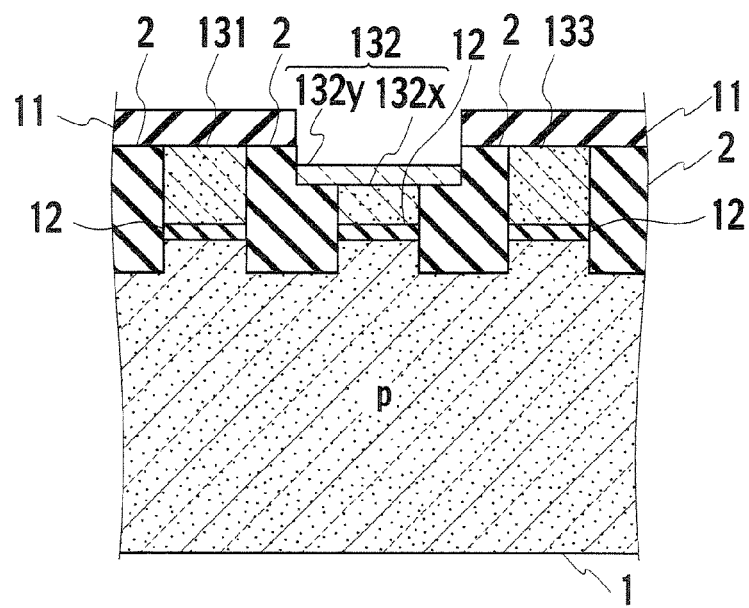
FIG. 54 is a cross-sectional view in the row direction after the process of FIG. 53.

Next, by selective etching such as the RIE method using the mask film 10 as a mask, as shown in FIG. 51, a part of the element isolation insulating film 2 is selectively removed. Thereafter, the mask film 10 is removed by selective etching. As shown in FIG. 52, on the upper surfaces of the element isolation insulating film 2, the first floating gate layers 131 and 133, and the lower member 132x, a phosphorus-doped polysilicon layer (third conductive layer) 13b is deposited by RPCVD and the like with a thickness in a range of approximately ten nm to approximately 200 nm, and is then etched back as shown in FIG. 53. A mask film 11 is deposited by CVD of the like on the upper surfaces of the element isolation insulating film 2, the first floating gate layers 131 and 133, and the polysilicon layer 13b. A resist film is spin-coated on the mask film 11, and an etching mask of the resist film is formed by photolithography technology. A part of the mask film 11 is selectively removed by RIE using the etching mask, and the like. After etching, the resist film is removed. By using the patterned mask film 10 as a mask, a part of the polysilicon layer 13b is removed. Then, the upper member 132y as shown in FIG. 54 is formed, and the second floating gate electrode 132 is thus formed.

Other Embodiments

Various modifications will become possible for that skilled in the art after receiving the teachings of the present disclosure without departing from the scope thereof.

In the embodiments, m×n memory cell transistors $MT_{11}$ to $MT_{1n}$, $MT_{21}$ to $MT_2$, . . . , $MT_{m1}$ to $MT_{mn}$ have been explained. However, actually, a cell array may be comprised by a plurality of memory cell transistors, memory cells and blocks.

Furthermore, in the embodiments, a multi-level storage, for example, a three-level or more storage in the NAND EEPROM is described. However, it is also possible to configure a binary NAND EEPROM.

What is claimed is:

1. A semiconductor memory comprising a plurality of memory cell transistors arranged in a matrix on a substrate, the semiconductor memory comprising:
    a first memory cell transistor including: a first floating gate electrode provided on the substrate and insulated from the substrate; and a first control gate electrode provided on the first floating gate electrode and insulated from the first floating gate electrode; and
    a second memory cell transistor adjacent to the first memory cell transistor in a row direction of the matrix, the second memory cell transistor including: a second floating gate electrode provided on the substrate and insulated from the substrate and separated from the first floating gate electrode, an upper surface of the second floating gate electrode being larger than a lower surface of the second floating gate electrode, and the upper surface of the second floating gate electrode being lower than an upper surface of the first floating gate electrode; and a second control gate electrode provided on the second floating gate electrode and insulated from the second floating gate electrode.

2. The memory of claim 1, wherein the second floating gate electrode has a cross-sectional T-shape in the row direction.

3. The memory of claim 1, wherein the second floating gate electrode has a cross-sectional hook shape in the row direction.

4. The memory of claim 1, wherein the second floating gate electrode has a plurality of upper surfaces.

5. The memory of claim 1, wherein the second floating gate electrode has a curved upper surface.

6. The memory of claim 1, wherein a plurality of first and second memory cell transistors are arranged alternately in the row direction.

7. The memory of claim 6, wherein a plurality of first floating gate electrodes are arranged in a column direction of the matrix, and a plurality of second floating gate electrodes are arranged adjacent to the plurality of first floating gate electrodes arranged in the column direction, respectively.

8. The memory of claim 6, wherein a plurality of first and second floating gate electrodes are arranged alternately in a column direction of the matrix.

9. The memory of claim 1, wherein the upper surface and a partial side surface of the first floating gate electrode are opposite to the first control gate electrode, and a lower surface of the first floating gate electrode is opposite to a channel region under the first floating gate electrode.

10. The memory of claim 1, wherein an area of the first floating gate electrode opposite to the first control gate electrode implementing a capacitor between the first floating gate electrode and the first control gate electrode is larger than an area of the first floating gate electrode opposite to a channel region under the first floating gate electrode.

11. The memory of claim 1, wherein the second floating gate electrode comprises:
- a lower member provided on the substrate and insulated from the substrate; and
- an upper member provided on the lower member and having a width wider than a width of the lower member in the row direction.

12. The memory of claim 11, wherein an upper surface of the upper member is opposite to the second control gate electrode, and a lower surface of the lower member is opposite to a channel region under the second floating gate electrode.

13. The memory of claim 1, wherein an area of the second floating gate electrode opposite to the second control gate electrode implementing a capacitor between the second floating gate electrode and the second control gate electrode is larger than an area of the second floating gate electrode opposite to a channel region under the second floating gate electrode.

* * * * *